(12) United States Patent
Kato et al.

(10) Patent No.: US 8,319,267 B2
(45) Date of Patent: Nov. 27, 2012

(54) DEVICE INCLUDING NONVOLATILE MEMORY ELEMENT

(75) Inventors: Kiyoshi Kato, Atsugi (JP); Yoshinori Ieda, Atsugi (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 60 days.

(21) Appl. No.: 12/943,532

(22) Filed: Nov. 10, 2010

(65) Prior Publication Data
US 2011/0114941 A1    May 19, 2011

(30) Foreign Application Priority Data

Nov. 13, 2009    (JP) .................. 2009-260211

(51) Int. Cl.
*H01L 29/788*    (2006.01)
(52) U.S. Cl. .............. 257/315; 257/324; 257/E21.422
(58) Field of Classification Search .......... 257/315, 257/324, E21.422
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,285,055 B1 * | 9/2001 | Gosain et al. | 257/317 |
| 6,294,274 B1 | 9/2001 | Kawazoe et al. | |
| 6,417,538 B1 | 7/2002 | Choi | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |

(Continued)

FOREIGN PATENT DOCUMENTS
EP    1737044 A    12/2006
(Continued)

OTHER PUBLICATIONS

Suresh.A et al., "Transparent indium gallium zinc oxide transistor based floating gate memory with platinum nanoparticles in the gate dielectric", Appl. Phys. Lett.(Applied Physics Letters), 2009, vol. 94, No. 12, pp. 123501-1-13501-3.

(Continued)

*Primary Examiner* — Jarrett Stark
*Assistant Examiner* — John M Parker
(74) *Attorney, Agent, or Firm* — Eric J. Robinson; Robinson Intellectual Property Law Office, P.C.

(57)    ABSTRACT

A device including a novel nonvolatile memory element is provided. A device including a nonvolatile memory element in which an oxide semiconductor is used as a semiconductor material for a channel formation region. The nonvolatile memory element includes a control gate, a charge accumulation layer which overlaps with the control gate with a first insulating film provided therebetween, and an oxide semiconductor layer formed using an oxide semiconductor material, which overlaps with the charge accumulation layer with a second insulating film provided therebetween.

14 Claims, 16 Drawing Sheets

U.S. PATENT DOCUMENTS

| | | | |
|---|---|---|---|
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,732,819 | B2 | 6/2010 | Akimoto et al. |
| 7,791,074 | B2 | 9/2010 | Iwasaki |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2002/0179964 | A1 | 12/2002 | Kato et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1* | 3/2006 | Hoffman et al. ............... 257/72 |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0127290 | A1 | 6/2007 | Kato |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0045397 | A1 | 2/2009 | Iwasaki |
| 2009/0057745 | A1* | 3/2009 | Yin et al. ...................... 257/315 |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0276689 | A1 | 11/2010 | Iwasaki |
| 2010/0279462 | A1 | 11/2010 | Iwasaki |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-021478 A | 1/1994 |
| JP | 08-264794 A | 10/1996 |
| JP | 11-505377 | 5/1999 |
| JP | 2000-044236 A | 2/2000 |
| JP | 2000-058685 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-103918 A | 4/2007 |
| JP | 2009-060087 A | 3/2009 |
| WO | WO-2004/114391 | 12/2004 |
| WO | WO-2007/029844 | 3/2007 |

OTHER PUBLICATIONS

Yin.H et al., "Fully transparent nonvolatile memory employing amorphous oxides as charge trap and transistor's channel layer", Appl. Phys. Lett.(Applied Physics Letters), 2008, vol. 93, No. 17, pp. 172109-1-172109-3.

International Search Report (Application No. PCT/JP2010/068770) Dated Dec. 21, 2010.

Written Opinion (Application No. PCT/JP2010/068770) Dated Dec. 21, 2010.

Fortunato.E et al., "Wide-Bandgap High-Mobility ZNO Thin-Film Transistors Produced at Room Temperature,", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3-Ga2ZnO4-ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3-In2O3-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

OHara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The"Blue",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous IN-GA-ZN-Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-277.

Park.S et al., "Challenge to Future Displays: Transparent AM-OLED Driven by Peald Grown ZNO TFT,", IMID '07 Digest, 2007, pp. 1249-1252.

Godo.H et al., "Temperature Dependence of Characteristics and Electronic Structure for Amorphous IN-GA-ZN-Oxide TFT,", AM-FPD '09 Digest of Technical Papers, Jul. 1, 2009, pp. 41-44.

Osada.T et al., "Development of Driver-Integrated Panel Using Amorphous IN-GA-ZN-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTS) for AMLCDs,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous IN-GA-ZN-Oxide TFT,", SID Digest '09 : SID International Symposium Digest of Technical Papers, May 31, 2009, pp. 1110-1112.

OHara.H et al., "21.3:4.0 In. QVGA AMOLED Display Using IN-GA-ZN-Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU or ZN] at Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08, : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214TH ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZNO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner memory cell memory cell

DEVICE INCLUDING NONVOLATILE MEMORY ELEMENT

TECHNICAL FIELD

The present invention relates to a device including a nonvolatile memory element capable of electrical writing, reading, and erasing and a method for manufacturing the device. In particular, the present invention relates to a device including a nonvolatile memory element provided with a charge accumulation layer and a method for manufacturing the device.

BACKGROUND ART

The market has been expanded for nonvolatile memory elements in which data can be electrically rewritten and can be stored even after the power is turned off. Such nonvolatile memory elements have a structure similar to that of a metal oxide semiconductor field effect transistor (MOSFET), in which a charge accumulation layer capable of accumulating charges for a long time is provided between a channel formation region and a control gate. A silicon-based semiconductor material has been known as a semiconductor material for forming a channel formation region which can be applied to the nonvolatile memory element (Patent Document 1).

Reference

[Patent Document 1] Japanese Published Patent Application No. 2000-058685

DISCLOSURE OF INVENTION

However, a nonvolatile memory element using a silicon-based semiconductor material has a problem in that a stable reading operation cannot be sufficiently obtained when the nonvolatile memory element has a larger capacity. This is because the number of memory cells which are connected to one bit line is increased, so that the leakage current of non-selected memory cells can not be disregarded. As a result, an increase in a memory cell array in size is difficult, and there has been a limitation on a reduction in a proportion of area occupied by a peripheral circuit.

In view of the above problem, an object of one embodiment of the present invention is to provide a device including a novel nonvolatile memory element.

One embodiment of the present invention provides a device including a nonvolatile memory element in which an oxide semiconductor is used as a semiconductor material for a channel formation region. The nonvolatile memory element includes a control gate, a charge accumulation layer which overlaps with the control gate with a first insulating film provided therebetween, and an oxide semiconductor layer formed using an oxide semiconductor material, which overlaps with the charge accumulation layer with a second insulating film provided therebetween.

In the above, a conductive material such as a metal material can be employed for the charge accumulation layer. In that case, the charge accumulation layer is provided to be insulated from its periphery; thus, the charge accumulation layer is referred to as a floating gate in some cases. Alternatively, a material other than the conductive material can be used for the charge accumulation layer; for example, a semiconductor material such as silicon or germanium, and an insulating material such as silicon nitride are given. In the case of using an insulating material such as silicon nitride for the charge accumulation layer, the charge accumulation layer is not necessarily provided so as to be insulated from its periphery. For example, in the case of using an insulating material such as silicon nitride for the charge accumulation layer, it is possible that the first insulating film is not provided between the charge accumulation layer and the control gate so that the charge accumulation layer and the control gate can be provided in contact with each other.

In the above, the device including a nonvolatile memory element includes a source electrode and a drain electrode which are electrically connected to the oxide semiconductor layer. The source electrode and the drain electrode can be provided so that the source electrode and/or the drain electrode have/has a portion overlapping with the charge accumulation layer with the second insulating film provided therebetween.

In the above, the nonvolatile memory element can be used for a device including a memory circuit in which memory cells are arranged in matrix. As the memory circuit in which memory cells each including the nonvolatile memory element are arranged in matrix, a NOR-type memory circuit and a NAND-type memory circuit are given, for example. In particular, the nonvolatile memory element can be used for a NOR-type flash memory circuit.

In the above, the device including a nonvolatile memory element can be provided with another element. Another element can be formed using the same material, film, and layer as the nonvolatile memory element. For example, the device including a nonvolatile memory element can be provided with a transistor. An oxide semiconductor can be used as a semiconductor material for forming a channel formation region of the transistor. Accordingly, when a transistor including an oxide semiconductor layer is provided in a pixel of a display device, a nonvolatile memory element and the transistor can be formed over one substrate. Alternatively, a transistor including an oxide semiconductor layer can be used as a selection transistor in the memory circuit. In that case, the nonvolatile memory element and the transistor can be electrically connected to each other.

In the above, for the oxide semiconductor layer, an In—Ga—Zn—O-based material, an In—Sn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Zn—O-based material, a Sn—Zn—O-based material, an Al—Zn—O-based material, an In—O-based material, a Sn—O-based material, or a Zn—O-based material can be used. The hydrogen concentration of the oxide semiconductor layer can be less than or equal to $5 \times 10^{19}/cm^3$, preferably less than or equal to $5 \times 10^{18}/cm^3$, further preferably less than or equal to $5 \times 10^{17}/cm^3$, further preferably less than or equal to $1 \times 10^{16}/cm^3$, further preferably less than $1 \times 10^{16}/cm^3$. The carrier concentration of the oxide semiconductor layer can be less than $1 \times 10^{14}/cm^3$, preferably less than $1 \times 10^{12}/cm^3$, further preferably less than $1 \times 10^{11}/cm^3$. The off-current of the nonvolatile memory element can be less than or equal to $1 \times 10^{-13}$ A.

Note that in this specification and the like, the term such as "over" or "below" does not necessarily mean that a component is placed "directly on" or "directly under" another component. For example, the expression "a first gate electrode over a gate insulating layer" does not exclude the case where a component is placed between the gate insulating layer and the gate electrode. Moreover, the terms such as "over" and "below" are only used for convenience of description and include the case where the relation of components is reversed, unless otherwise specified.

In addition, in this specification and the like, the term "electrode" or "wiring" does not limit a function of a component. For example, an "electrode" can be used as part of a "wiring", and vice versa. Further, the term such as "electrode" or "wiring" includes the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Examples of an object having any electric function are a switching element such as a transistor, a resistor, an inductor, a capacitor, and an element with a variety of functions as well as an electrode and a wiring.

According to one embodiment of the present invention, a stable operation of a circuit can be realized when the circuit is formed using a nonvolatile memory element using an oxide semiconductor. The off-current of the nonvolatile memory element using an oxide semiconductor is extremely small; thus, the leakage current of a non-selected memory cell can be extremely small, leading to a stable operation, in particular, a stable reading operation. Moreover, since the leakage current of the bit line BL is extremely small, the number of memory cells which are connected to one bit line can be increased. Therefore, a device including a nonvolatile memory element which operates stably and is suitable for large capacity can be realized. Such a device including a nonvolatile memory element is particularly effective in the case where a transistor including an oxide semiconductor layer is provided in a pixel of a display device because the nonvolatile memory element and the pixel can be manufactured over one substrate.

BEST MODE FOR CARRYING OUT THE INVENTION

Figure 1A:
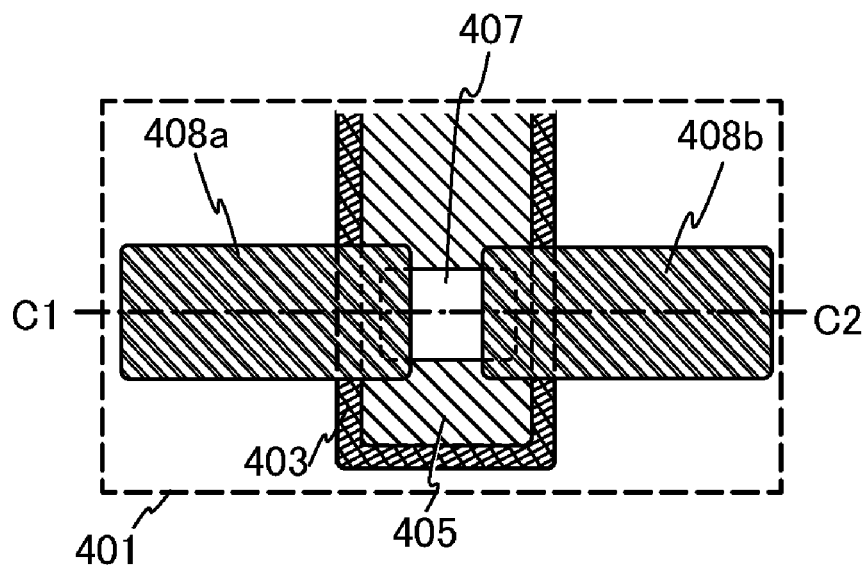
FIGS. 1A and 1B illustrate an example of a plan view and a cross-sectional view of a device including a nonvolatile memory element.

Embodiments of the present invention will be described below with reference to the drawings. However, the present invention is not limited to the following description. It is easily understood by those skilled in the art that the mode and detail can be changed in various ways unless departing from the scope and spirit of the present invention. Therefore, the present invention should not be construed as being limited to the following description of the embodiments. Note that in describing structures of the present invention with reference to drawings, the same reference numerals are used in common for the same portions in different drawings.

Note that the size, the thickness of a layer, and a region of each structure illustrated in the drawings and the like in the embodiments are exaggerated for simplicity in some cases. Therefore, embodiments of the present invention are not limited to such scales.

Note that terms with ordinal numbers such as "first", "second", and "third" in this specification are used in order to identify components, and the terms do not limit the components numerically.

(Embodiment 1)

In this embodiment, a structure, a manufacturing method, and an operation principle of a device including a nonvolatile memory element according to one embodiment of the present invention will be described with reference to FIGS. 1A and 1B, FIGS. 2A to 2F, FIGS. 3A to 3D, and FIG. 4.

⟨Plan Structure and Cross-Sectional Structure of Nonvolatile Memory Element⟩

Figure 1B:
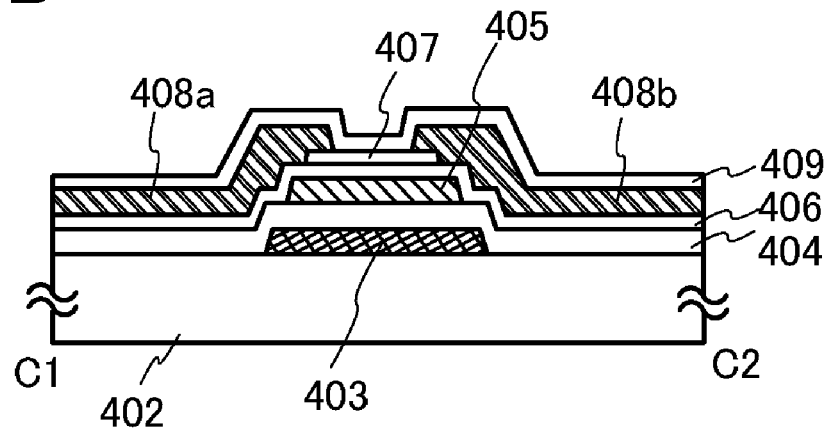

FIGS. 1A and 1B illustrate an example of a structure of a nonvolatile memory element. FIG. 1A is a plan view of the nonvolatile memory element and FIG. 1B is a cross-sectional view thereof. FIG. 1B corresponds to a cross-sectional view taken along line C1-C2 in FIG. 1A.

A nonvolatile memory element 401 includes a control gate 403 provided over a substrate 402, a first insulating film 404 which overlaps with the control gate 403, a charge accumulation layer 405 in contact with the first insulating film 404, a second insulating film 406 which overlaps with the charge accumulation layer 405, an oxide semiconductor layer 407 which overlaps with the second insulating film 406, and a source electrode 408a and a drain electrode 408b which are electrically connected to the oxide semiconductor layer 407. The charge accumulation layer 405 is provided between the oxide semiconductor layer 407 and the control gate 403.

The charge accumulation layer 405 is provided so as to overlap with a channel formation region included in the oxide semiconductor layer 407 with the second insulating film 406 provided therebetween. Further, the charge accumulation layer 405 is provided so as to overlap with the control gate 403 with the first insulating film 404 provided therebetween.

An oxide insulating film 409 is provided over the control gate 403, the first insulating film 404, the charge accumulation layer 405, the second insulating film 406, the source electrode 408a, and the drain electrode 408b included in the nonvolatile memory element 401.

The oxide semiconductor layer 407 has portions overlapping with the source electrode 408a and the drain electrode 408b when seen from the above.

A conductive material can be employed for the charge accumulation layer 405. However, one embodiment of the present invention is not limited thereto. A material other than the conductive material can be used for the charge accumulation layer 405; for example, a semiconductor material such as silicon or germanium, and an insulating material such as silicon nitride are given. In the case of using an insulating material such as silicon nitride for the charge accumulation layer 405, the charge accumulation layer 405 is not necessarily provided so as to be insulated from its periphery. For example, in the case of using an insulating material such as silicon nitride for the charge accumulation layer 405, it is possible that the first insulating film 404 is not provided between the charge accumulation layer 405 and the control gate 403 so that the charge accumulation layer 405 and the control gate 403 can be provided in contact with each other.

Here, when seen from the above, the source electrode 408a and/or the drain electrode 408b preferably include/includes a portion overlapping with the charge accumulation layer 405 with the second insulating film 406 provided therebetween. In other words, it is preferable that only the second insulating film 406 be provided between the source electrode 408a and the charge accumulation layer 405 and/or between the drain electrode 408b and the charge accumulation layer 405, without the oxide semiconductor layer 407. That is, the source electrode 408a and/or the drain electrode 408b preferably include/includes a portion in contact with the second insulating film 406, and in the portion in contact with the second insulating film 406, the source electrode 408a and/or the drain electrode 408b include/includes a portion overlapping with the charge accumulation layer 405 with the second insulating film 406 provided therebetween.

In order to employ such a structure, the charge accumulation layer 405 and the oxide semiconductor layer 407 are formed to have a portion where they do not overlap with each other, when seen from the above. For example, as illustrated in FIG. 1A, the width of the oxide semiconductor layer 407 can be smaller than the width of the charge accumulation layer 405 in a channel length direction (a direction along line C1-C2). Thus, when the source electrode 408a and the drain electrode 408b which overlap with part of the oxide semiconductor layer 407 later are formed, it is possible that the source electrode 408a and the drain electrode 408b each inevitably include a portion which overlaps with the charge accumulation layer 405 with the second insulating film 406 provided therebetween, at least in the channel length direction.

Further, as illustrated in FIG. 1A, the width of the oxide semiconductor layer 407 can be smaller than the width of the charge accumulation layer 405 in a channel width direction.

The width of the source electrode 408a and/or the width of the drain electrode 408b can be larger than the width of the oxide semiconductor layer 407 in a channel width direction. Accordingly, in the channel width direction, the source electrode 408a and/or the drain electrode 408b can be formed so as to include a portion overlapping with the charge accumulation layer 405 with the second insulating film 406 provided therebetween.

For the oxide semiconductor layer 407, an In—Ga—Zn—O-based material, an In—Sn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, an In—Zn—O based material, a Sn—Zn—O-based material, an Al—Zn—O-based material, an In—O-based material, a Sn—O-based material, or a Zn—O-based material is preferably used.

The oxide semiconductor layer 407 is preferably highly purified by sufficient removal of impurities such as hydrogen. Specifically, the hydrogen concentration of the oxide semiconductor layer 407 is less than or equal to $5\times10^{19}/cm^3$, preferably less than or equal to $5\times10^{18}/cm^3$, further preferably less than or equal to $5\times10^{17}/cm^3$, further preferably less than or equal to $1\times10^{16}/cm^3$, further preferably less than $1\times10^{16}/cm^3$. The carrier concentration of the oxide semiconductor layer 407 can be less than $1\times10^{14}/cm^3$, preferably less than $1\times10^{12}/cm^3$, further preferably less than $1\times10^{11}/cm^3$. The carrier concentration of the oxide semiconductor layer 407 which is highly purified by sufficient reduction in the hydrogen concentration is sufficiently small (approximately $1\times10^{14}/cm^3$) as compared with the carrier concentration of a general silicon wafer (a silicon wafer to which a small amount of an impurity element such as phosphorus or boron is added).

With the use of such an oxide semiconductor which is highly purified by sufficient reduction in the hydrogen concentration, of sufficiently low carrier concentration, and i-type or substantially i-type, the nonvolatile memory element 401 having extremely excellent off-current characteristics can be obtained. For example, when the drain voltage Vd applied to a drain electrode is +1 V or +10 V and the gate voltage Vg applied to a control gate is in the range of −5 V to −20 V, the off-current at a normal temperature is less than or equal to $1\times10^{-13}$ A. As described above, the oxide semiconductor layer 407 which is highly purified by sufficient reduction in the hydrogen concentration is employed, so that the off-current of the nonvolatile memory element 401 is reduced. Accordingly, a device with a novel structure including the nonvolatile memory element 401 can be realized. Note that the hydrogen concentration of the oxide semiconductor layer 407 is measured by secondary ion mass spectroscopy (SIMS).

A conductive film can be used as a material for the source electrode and the drain electrode. Specifically, an element selected from Al, Cr, Cu, Ta, Ti, Mo, and W, an alloy containing any of these elements as a component, an alloy film containing any of these elements in combination, or the like is given. Alternatively, one or more materials selected from manganese, magnesium, zirconium, beryllium, thorium, and yttrium may be used. The conductive film may have a single-layer structure or a stacked structure of two or more layers. For example, a single-layer structure of an aluminum film including silicon, a two-layer structure in which a titanium film is stacked over an aluminum film, and a three-layer structure in which a titanium film, an aluminum film, and a titanium film are stacked in this order are given. Alternatively, a film, an alloy film, or a nitride film of a combination of Al and one or more elements selected from the followings may be used: titanium (Ti), tantalum (Ta), tungsten (W), molybdenum (Mo), chromium (Cr), neodymium (Nd), and scandium (Sc). Further alternatively, an In—Ga—Zn—O-based oxide conductive semiconductor film, an In—Sn—O-based oxide conductive semiconductor film, an In—Sn—Zn—O-based oxide conductive semiconductor film, an In—Al—Zn—O-based oxide conductive semiconductor film, a Sn—Ga—Zn—O-based oxide conductive semiconductor film, an Al—Ga—Zn—O-based oxide conductive semiconductor film, a Sn—Al—Zn—O-based oxide conductive semiconductor film, an In—Zn—O-based oxide conductive semiconductor film, a Sn—Zn—O-based oxide conductive semiconductor film, an Al—Zn—O-based oxide conductive semiconductor film, an In—O-based oxide conductive semiconductor film, a Sn—O-based oxide conductive semiconductor film, or a Zn—O-based oxide conductive semiconductor film can be used. In that case, as compared with a material for the oxide semiconductor layer 407, a material whose conductivity is high or whose resistivity is low is preferably used. The conductivity of an oxide conductive film can be increased by an increase in the carrier concentration. The carrier concentration (the electron concentration) of an oxide conductive film can be increased by an increase in the hydrogen concentration. Further, the carrier concentration (the electron concentration) of an oxide conductive film can be increased by an increase in oxygen deficiency.

In an element whose channel formation region is formed using a silicon-based material, a step of implantation of an impurity element imparting a conductivity type, such as phosphorus or boron, or a step of formation of a semiconductor layer including the impurity element is needed for forming a source region and a drain region. Further, a step of activation of the impurity element is needed. On the other hand, in an element whose channel formation region is formed using an oxide semiconductor layer according to one embodiment of the present invention, a special step for forming the source region and the drain region is not needed.

The element whose channel formation region is formed using an oxide semiconductor layer can be formed without an impurity element imparting a conductivity type such as phosphorus or boron, which is one of the characteristics of the element. The above-described element using an oxide semiconductor layer according to one embodiment of the present invention is a novel element that is entirely different from an element using a silicon-based material.

⟨Method for Manufacturing Device Including Nonvolatile Memory Element⟩

Steps of manufacturing the nonvolatile memory element 401 will be described with reference to FIGS. 2A to 2F and FIGS. 3A to 3D.

First, a conductive film 410 is formed over the substrate 402, and then the control gate 403 is formed by a photolithography step. Note that a resist mask may be formed by an ink-jet method. When a resist mask is formed by an ink-jet method, a manufacture cost can be reduced because a photomask is not used (see FIGS. 2A and 2B).

As the substrate 402, a substrate having an insulating surface can be used. It is necessary that the substrate 402 have at least heat resistance high enough to withstand heat treatment performed later. For example, a glass substrate made of barium borosilicate glass, aluminoborosilicate glass, or the like can be used.

When the temperature of the heat treatment performed later is high, a glass substrate having a strain point of 730° C. or higher can be used. The glass substrate can be formed using a material such as aluminosilicate glass, aluminoborosilicate glass, or barium borosilicate glass, for example. In general, more practical glass with heat resistance can be obtained when it contains a larger amount of barium oxide (BaO) than boron oxide ($B_2O_3$). Therefore, a glass substrate containing a larger amount of BaO than $B_2O_3$ is preferably used.

Instead of the glass substrate, a substrate formed of an insulator, such as a ceramic substrate, a quartz substrate, a sapphire substrate, or a crystallized glass substrate can be used. Alternatively, a semiconductor substrate over which an insulating film is formed, or the like can be used.

An insulating film serving as a base film may be provided between the substrate 402 and the control gate 403. The base film has a function of preventing diffusion of an impurity element from the substrate 402, and can be formed to have a single-layer structure or a stacked structure using one or more films selected from a silicon nitride film, a silicon oxide film, a silicon nitride oxide film, and a silicon oxynitride film.

The control gate 403 can be formed to have a single-layer or stacked-layer structure using a metal material such as molybdenum, titanium, chromium, tantalum, tungsten, aluminum, copper, neodymium, or scandium, or an alloy material which contains any of these materials as its main component. For example, as a two-layer structure, any of the following structures is preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, a two-layer structure of a titanium nitride layer and a molybdenum layer, and a two-layer structure of a tungsten nitride layer and a tungsten layer. As a three-layer structure, a stacked-layer of a tungsten layer or a tungsten nitride layer, an alloy of aluminum and silicon or an alloy of aluminum and titanium, and a titanium nitride layer or a titanium layer is preferable.

Figure 2A:
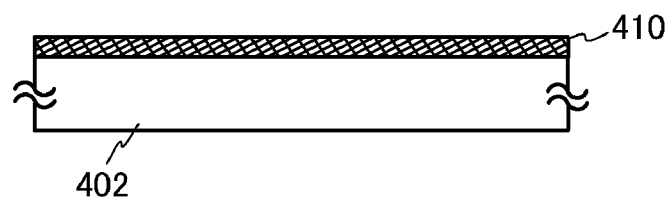
FIGS. 2A to 2F illustrate an example of a method for manufacturing a device including a nonvolatile memory element.
Figure 2B:
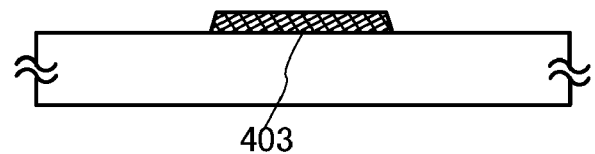
Figure 2C:
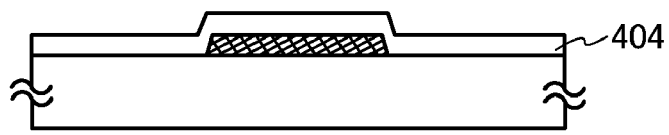

Next, the first insulating film 404 is formed over the control gate 403 (see FIG. 2C).

The first insulating film 404 can be formed to have a single layer of a silicon oxide layer, a silicon nitride layer, a silicon oxynitride layer, a silicon nitride oxide layer, or an aluminum oxide layer or a stacked layer thereof by a plasma CVD method, a sputtering method, or the like. For example, a silicon oxynitride layer may be formed by a plasma CVD method using $SiH_4$, oxygen, and nitrogen as a deposition gas. The thickness of the first insulating film 404 can be set to 10 to 100 nm, for example, 20 to 40 nm.

Figure 2D:
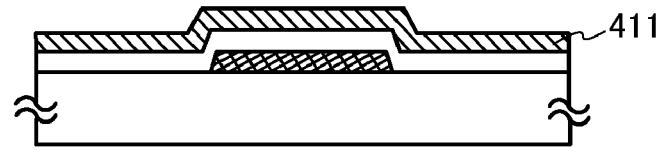
Figure 2E:
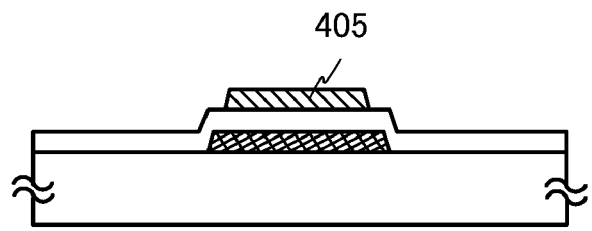
Figure 2F:
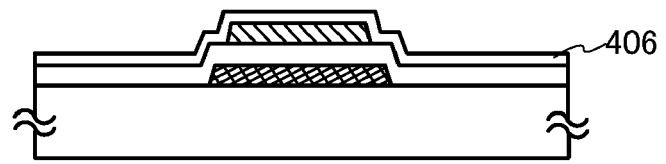

Next, a conductive film 411 is formed over the first insulating film 404, and then the charge accumulation layer 405 is formed by a photolithography step (see FIGS. 2D and 2E).

The conductive film 411 is formed by a plasma CVD method, a sputtering method, or the like, and after that, the charge accumulation layer 405 is formed by a photolithography step. As a material for the charge accumulation layer 405, a metal layer including an element selected from Al, Cr, Ta, Ti, Mo, and W, a metal nitride layer including any of these elements as a component (a titanium nitride layer, a molybdenum nitride layer, a tungsten nitride layer), or the like can be used. Typically, a tungsten layer, a titanium nitride layer, and a molybdenum layer are given, and a tungsten layer can be used, for example.

Next, the second insulating film 406 is formed over the charge accumulation layer 405. The second insulating film 406 is an insulating film in which a tunneling current flows; thus, the second insulating film 406 is preferably thinner than the first insulating film 404. In addition, the second insulating film 406 is preferably a dense film having high threshold voltage and high reliability. The thickness of the second insulating film 406 depends on the channel length L, and can be greater than or equal to 6 nm and less than or equal to 20 nm, preferably greater than or equal to 8 nm and less than or equal to 12 nm, for example. The second insulating film 406 can be formed to a thickness of 10 nm, for example. The second insulating film 406 can be formed to have a single layer of a silicon oxide layer, a silicon nitride layer, a silicon oxynitride layer, a silicon nitride oxide layer, or an aluminum oxide layer or a stacked layer thereof by a plasma CVD method, a sputtering method, or the like. For example, a silicon oxynitride layer can be formed by a plasma CVD method using $SiH_4$, oxygen, and nitrogen as a deposition gas (see FIG. 2F).

Figure 3A:
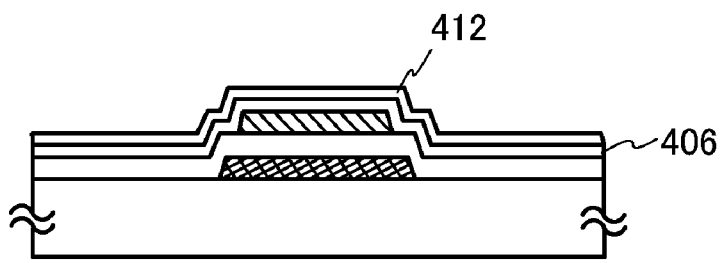
FIGS. 3A to 3D illustrate the example of a method for manufacturing a device including a nonvolatile memory element.
Figure 3B:
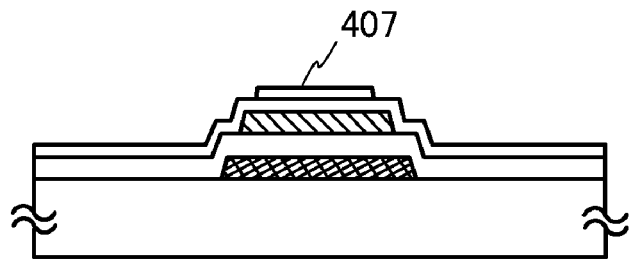
Figure 3C:
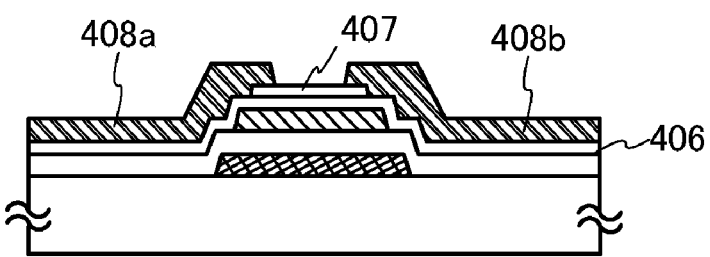
Figure 3D:
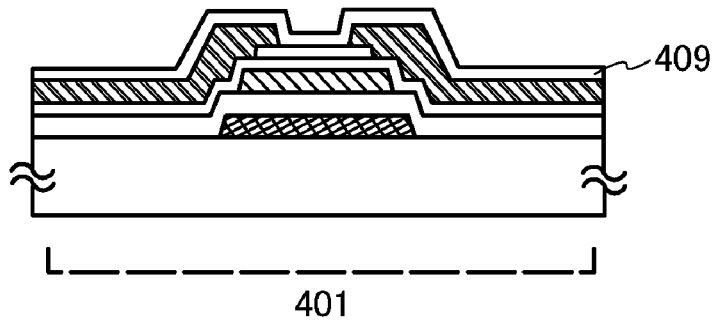

Next, an oxide semiconductor film 412 is formed over the second insulating film 406 (see FIG. 3A).

Note that before the oxide semiconductor film 412 is formed, dust on a surface of the second insulating film 406 is preferably removed by reverse sputtering in which an argon gas is introduced to a sputtering apparatus and plasma is generated. Instead of an argon atmosphere, a nitrogen atmosphere, a helium atmosphere, an oxygen atmosphere, or the like may be used.

As the oxide semiconductor film 412, an In—Ga—Zn—O-based oxide semiconductor film, an In—Sn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film can be used. In this embodiment, the oxide semiconductor film 412 is formed using an In—Ga—Zn—O-based metal oxide target by a sputtering method. The oxide semiconductor film 412 can be formed by a sputtering method in a rare gas (typically argon) atmosphere, an oxygen atmosphere, or an atmosphere containing a rare gas (typically argon) and oxygen. In the case of using a sputtering method, the oxide semiconductor film 412 may be formed using a target including $SiO_2$ at greater than or equal to 2 wt % and less than or equal to 10 wt %.

As a target for forming the oxide semiconductor film 412 by a sputtering method, a metal oxide target including zinc oxide as its main component can be used. As another example of the metal oxide target, a metal oxide target including In, Ga, and Zn (with a composition ratio of $In_2O_3:Ga_2O_3:ZnO=1:1:1$ (molar ratio)) can be used. As the metal oxide target including In, Ga, and Zn, a target with a composition ratio of $In_2O_3:Ga_2O_3:ZnO=1:1:2$ (molar ratio) or a target with a composition ratio of $In_2O_3:Ga_2O_3:ZnO=1:1:4$ (molar ratio) can also be used. The filling rate of the metal oxide target is greater than or equal to 90% and less than or equal to 100%, and preferably greater than or equal to 95% and less than or equal to 99.9%. The use of a metal oxide target having a high filling rate makes it possible to form a dense oxide semiconductor film.

As a sputtering gas used in formation of the oxide semiconductor film 412, a high-purity gas in which the concentration of an impurity such as hydrogen, water, hydroxyl, or hydride is reduced to approximately the ppm level or the ppb level is preferably used.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

There is also a multi-source sputtering apparatus in which a plurality of targets of different materials can be set. With the multi-source sputtering apparatus, films of different materials can be deposited to be stacked in one chamber, and films of plural kinds of materials can be deposited by electric discharge at the same time in one chamber.

There are also a sputtering apparatus provided with a magnet system inside the chamber and used for a magnetron sputtering method, and a sputtering apparatus used for an ECR sputtering method in which plasma generated with the use of microwaves is used without using glow discharge.

As a film formation method using a sputtering method, there are also a reactive sputtering method in which a target substance and a sputtering gas component are chemically reacted with each other during film formation to form a thin film of a compound thereof, and a bias sputtering method in which voltage is also applied to a substrate during film formation.

The oxide semiconductor film 412 is formed by any of the above sputtering methods.

When the oxide semiconductor film 412 is formed, the substrate is held inside a treatment chamber which is kept in a reduced pressure state, and the substrate temperature is set to be greater than or equal to 100° C. and less than or equal to 600° C., preferably greater than or equal to 200° C. and less than or equal to 400° C. By heating the substrate during deposition, the impurity concentration of the oxide semiconductor film formed can be reduced. In addition, damage by sputtering can be reduced. A sputtering gas from which hydrogen and moisture have been removed is introduced while residual moisture in the treatment chamber is removed, and a metal oxide is used as a target. Thus, the oxide semiconductor film is formed over the substrate. In order to remove residual moisture in the treatment chamber, an entrapment vacuum pump is preferably used. For example, a cryopump, an ion pump, or a titanium sublimation pump is preferably used. An evacuation unit can be a turbo pump provided with a cold trap. In the deposition chamber in which evacuation is performed with the cryopump, a hydrogen atom and a compound containing a hydrogen atom, such as water ($H_2O$) (preferably, a compound including a carbon atom as well), are removed, for example; thus, the impurity concentration of the oxide semiconductor film formed in the deposition chamber can be reduced.

As an example of film formation conditions, the following conditions are employed: the distance between the substrate and the target is 100 mm, the pressure is 0.6 Pa, the direct-current (DC) power is 0.5 kW, and an oxygen atmosphere (the proportion of the oxygen flow is 100%) is used. A pulse direct current (DC) power supply is preferable because powder substances (also referred to as particles or dust) generated in the film formation can be reduced and the film thickness can be made uniform. Note that an appropriate thickness differs depending on an oxide semiconductor material and the size and structure of an element, and the thickness may be set as appropriate depending on the material, and the size and structure of an element. For example, the thickness of the oxide semiconductor film can be set to greater than or equal to 2 nm and less than or equal to 200 nm. In the case where the channel length is short, the thickness of the oxide semiconductor film can be set to greater than or equal to 5 nm and less than or equal to 30 nm, for example. The size of an element is reduced in such a manner, high integration can be achieved, a short-channel effect can be suppressed by reduction in the thickness of the oxide semiconductor film.

Next, the oxide semiconductor film 412 is processed into an island-shaped oxide semiconductor layer in a photolithography step. A resist mask for forming the island-shaped oxide semiconductor layer may be formed by an ink-jet method. When the resist mask is formed by an ink-jet method, a photomask is not used; thus, the manufacture cost can be reduced.

Next, first heat treatment is performed on the oxide semiconductor layer. Dehydration or dehydrogenation of the oxide semiconductor layer can be performed through the first heat treatment. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 407 is obtained (see FIG. 3B).

The heat treatment apparatus is not limited to the electric furnace and may be the one provided with a device for heating a process object using heat conduction or heat radiation from a heating element such as a resistance heating element. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the gas, an inert gas which does not react with a process object by heat treatment, such as nitrogen or a rare gas such as helium, neon, or argon is used.

For example, as the first heat treatment, GRTA may be performed in the following manner. The substrate is transferred and put in an inert gas which has been heated to a high temperature of 650° C. to 700° C., heated for several minutes, and transferred and taken out of the inert gas which has been heated to a high temperature. GRTA enables a high-temperature heat treatment in a short time.

Note that an inert gas such as nitrogen or a rare gas such as helium, neon, or argon can be used as an atmosphere of the first heat treatment. It is preferable that water, hydrogen, and the like be not contained in the atmosphere of the first heat treatment. Alternatively, the purity of nitrogen or a rare gas such as helium, neon, or argon introduced into a heat treatment apparatus is preferably greater than or equal to 6N (99.9999%), further preferably greater than or equal to 7N (99.99999%) (that is, the impurity concentration is less than or equal to 1 ppm, preferably less than or equal to 0.1 ppm).

In the case where an electrical furnace is used in the first heat treatment, an atmosphere can be changed when a heat treatment temperature falls. For example, an inert gas such as nitrogen or a rare gas such as helium, neon, or argon is used as an atmosphere during heat treatment, and the atmosphere is switched to an atmosphere containing oxygen when the heat treatment temperature falls. As the atmosphere containing oxygen, an oxygen gas or a mixed gas of an oxygen gas and a nitrogen gas can be used. In the case where the atmosphere containing oxygen is employed, it is preferable that the atmosphere do not contain water, hydrogen, or the like. Alternatively, the purity of the oxygen gas or the nitrogen used is preferably greater than or equal to 6N (99.9999%), further preferably greater than or equal to 7N (99.99999%) (that is, the impurity concentration is less than or equal to 1 ppm, preferably less than or equal to 0.1 ppm).

Further, the oxide semiconductor layer may be crystallized to be a microcrystalline or a polycrystalline depending on the condition of the first heat treatment or a material of the oxide semiconductor layer. For example, the oxide semiconductor layer may be crystallized to be a microcrystalline oxide semiconductor having a degree of crystallization of 90% or more, or 80% or more. The oxide semiconductor may become an amorphous oxide semiconductor containing no crystalline component depending on the condition of the first heat treatment or a material of the oxide semiconductor. The oxide semiconductor may become an oxide semiconductor in which a microcrystalline portion (with a grain diameter greater than or equal to 1 nm and less than or equal to 20 nm, typically greater than or equal to 2 nm and less than or equal to 4 nm) is mixed into an amorphous oxide semiconductor.

The first heat treatment may be performed on the oxide semiconductor film 412 before being processed into the island-shaped oxide semiconductor layer, instead of on the island-shaped oxide semiconductor layer. In that case, after the first heat treatment, the substrate is taken out of the heating apparatus and a photolithography step is performed.

The heat treatment having an effect of dehydrating or dehydrogenating the oxide semiconductor layer may be performed at any of the following timings: after the oxide semiconductor layer is formed; after a source electrode and a drain electrode are formed over the oxide semiconductor layer; and after a protective insulating film is formed over the source electrode and the drain electrode.

The conductive film is formed over the second insulating film 406 and the oxide semiconductor layer 407. Then, a resist mask is formed over the conductive film by a photolithography step, and subjected to selective etching so that the source electrode 408a and the drain electrode 408b are formed. After that, the resist mask is removed (see FIG. 3C).

A conductive film can be used as a material for the source electrode 408a and the drain electrode 408b. The conductive film can be formed using a sputtering method or a vacuum evaporation method. Specifically, an element selected from Al, Cr, Cu, Ta, Ti, Mo, and W, an alloy containing any of these elements as a component, an alloy film containing any of these elements in combination, or the like is given. Alternatively, one or more materials selected from manganese, magnesium, zirconium, beryllium, thorium, and yttrium may be used. The conductive film may have a single-layer structure or a stacked structure of two or more layers. For example, a single-layer structure of an aluminum film including silicon, a two-layer structure in which a titanium film is stacked over an aluminum film, and a three-layer structure in which a titanium film, an aluminum film, and a titanium film are stacked in this order are given. Alternatively, a film, an alloy film, or a nitride film of a combination of Al and one or more elements selected from the followings may be used: titanium (Ti), tantalum (Ta), tungsten (W), molybdenum (Mo), chromium (Cr), neodymium (Nd), and scandium (Sc). Further alternatively, an In—Ga—Zn—O-based oxide conductive semiconductor film, an In—Sn—O-based oxide conductive semiconductor film, an In—Sn—Zn—O-based oxide conductive semiconductor film, an In—Al—Zn—O-based oxide conductive semiconductor film, a Sn—Ga—Zn—O-based oxide conductive semiconductor film, an Al—Ga—Zn—O-based oxide conductive semiconductor film, a Sn—Al—Zn—O-based oxide conductive semiconductor film, an In—Zn—O-based oxide conductive semiconductor film, a Sn—Zn—O-based oxide conductive semiconductor film, an Al—Zn—O-based oxide conductive semiconductor film, an In—O-based oxide conductive semiconductor film, a Sn—O-based oxide conductive semiconductor film, or a Zn—O-based oxide conductive semiconductor film can be used. In that case, as compared with a material for the oxide semiconductor layer 407, a material whose conductivity is high or whose resistivity is low is preferably used. The conductivity of an oxide conductive film can be increased by an increase in the carrier concentration. The carrier concentration of an oxide conductive film can be increased by an increase in the hydrogen concentration. Further, the carrier concentration of an oxide conductive film can be increased by an increase in oxygen deficiency.

In the case where heat treatment is performed after formation of the conductive film, the conductive film preferably has heat resistance enough to withstand the heat treatment.

Here, when seen from the above, the source electrode 408*a* and/or the drain electrode 408*b* preferably include/includes a portion overlapping with the charge accumulation layer 405 with the second insulating film 406 provided therebetween. In other words, it is preferable that only the second insulating film 406 be provided between the source electrode 408*a* and the charge accumulation layer 405 and/or between the drain electrode 408*b* and the charge accumulation layer 405, without the oxide semiconductor layer 407. That is, the source electrode 408*a* and/or the drain electrode 408*b* preferably include/includes a portion in contact with the second insulating film 406, and in the portion in contact with the second insulating film 406, source electrode 408*a* and/or the drain electrode 408*b* include/includes a portion overlapping with the charge accumulation layer 405 with the second insulating film 406 provided therebetween. In order to employ such a structure, the charge accumulation layer 405 and the oxide semiconductor layer 407 are formed to have a portion where they do not overlap with each other, when seen from the above.

Ultraviolet light, KrF laser light, or ArF laser light can be used for light exposure for forming the resist mask in the photolithography step for forming the source electrode 408*a* and the drain electrode 408*b*. The channel length L of the nonvolatile memory element 401 is determined by a distance between a lower end of the source electrode and a lower end of the drain electrode which are adjacent to each other over the oxide semiconductor layer 407. In the case where light exposure is performed for a channel length L of less than 25 nm, the light exposure at the time of the formation of the resist mask in the photolithography step is performed using extreme ultraviolet light having an extremely short wavelength of several nanometers to several tens of nanometers. The exposure with extreme ultraviolet light yields high resolution and a great depth of focus; thus, the channel length L can be greater than or equal to 10 nanometers and less than or equal to 1000 nanometers. Accordingly, an element can be reduced in size, leading to high integration. Further, the operation speed of a circuit can be increased, and furthermore, an off current can be extremely small, so that low power consumption can be achieved.

In this embodiment, as the conductive film for forming the source electrode 408*a* and the drain electrode 408*b*, a Ti film is used. As an etchant for the conductive film, an ammonia hydrogen peroxide mixture (a mixed solution of ammonia, water, and a hydrogen peroxide solution) is used.

Note that in the photolithography step, part of the oxide semiconductor layer 407 is etched, whereby an oxide semiconductor layer having a groove (a depressed portion) might be formed. A resist mask for forming the source electrode 408*a* and the drain electrode 408*b* may be formed by an ink-jet method. When the resist mask is formed by an ink-jet method, a photomask is not used; thus, the manufacture cost can be reduced.

Further, an oxide conductive layer may be formed between the oxide semiconductor layer 407 and the source electrode 408*a* and between the oxide semiconductor layer 407 and the drain electrode 408*b*. The oxide conductive layer and a metal layer for forming the source and drain electrodes can be formed successively. In that case, the oxide conductive layer can function as source and drain regions. When the oxide conductive layer is provided, the resistance of the source and drain regions can be reduced and performance of the circuit can be increased.

In order to reduce the number of photomasks used in a photolithography step and reduce the number of photolithography steps, an etching step may be performed with the use of a resist mask formed using a multi-tone mask which is a light-exposure mask through which light is transmitted to have a plurality of intensities. A resist mask formed using a multi-tone mask has a plurality of thicknesses and further can be changed in shape by etching; thus, the resist mask can be used in a plurality of etching steps for processing into different patterns. That is, a resist mask corresponding to at least two kinds of different patterns can be formed by using a multi-tone mask. Thus, the number of light-exposure masks can be reduced and the number of corresponding photolithography steps can also be reduced, whereby a process can be simplified.

Next, plasma treatment is performed using a gas such as $N_2O$, $N_2$, or Ar. This plasma treatment removes water or the like attached to an exposed surface of the oxide semiconductor layer. Plasma treatment may be performed using a mixed gas of oxygen and argon.

After the plasma treatment, an oxide insulating film 409 which functions as a protective insulating film in contact with part of the oxide semiconductor layer is formed without exposure to the air.

The oxide insulating film 409 can be formed to at least 1 nm by a method such as a sputtering method, by which impurities such as water and hydrogen are prevented from being mixed to the oxide insulating film 409, as appropriate. When hydrogen is contained in the oxide insulating film 409, the hydrogen may enter the oxide semiconductor layer or extract oxygen in the oxide semiconductor layer, whereby the backchannel of the oxide semiconductor layer might have a lower resistance (have an n-type conductivity) and a parasitic channel might be formed. Therefore, it is important that a formation method in which hydrogen is not used is employed in order to form the oxide insulating film 409 containing as little hydrogen as possible.

In this embodiment, a 200-nm-thick silicon oxide film is formed as the oxide insulating film 409 by a sputtering method. The substrate temperature in film formation may be greater than or equal to room temperature and less than or equal to 300° C. and in this embodiment, is 100° C. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target can be used. For example, with the use of a silicon target, silicon oxide can be formed by a sputtering method in an atmosphere of oxygen and nitrogen. As the oxide insulating film 409 which is formed in contact with the oxide semiconductor layer having a low resistance, an inorganic insulating film which does not include impurities such as moisture, a hydrogen ion, and $OH^-$ and blocks entry of these impurities from the outside is used. Typically, a silicon oxide film, a silicon oxynitride film, an aluminum oxide film, an aluminum oxynitride film, or the like is used.

In that case, it is preferable to remove residual moisture in the treatment chamber in the formation of the oxide insulating film 409, in order that hydrogen, a hydroxyl group, or moisture is not contained in the oxide semiconductor layer 407 and the oxide insulating film 409.

In order to remove residual moisture in the treatment chamber, an entrapment vacuum pump is preferably used. For example, a cryopump, an ion pump, or a titanium sublimation pump is preferably used. An evacuation unit can be a turbo pump provided with a cold trap. In the deposition chamber in which evacuation is performed with the cryopump, a hydrogen atom and a compound containing a hydrogen atom, such as water ($H_2O$), are removed, for example; thus, the impurity concentration of the oxide insulating film 409 formed in the deposition chamber can be reduced.

As a sputtering gas used in formation of the oxide insulating film 409, a high-purity gas in which the concentration of an impurity such as hydrogen, water, hydroxyl, or hydride is reduced to approximately the ppm level or the ppb level is preferably used. The oxide insulating film 409 is preferably formed to be an oxygen-excess film.

Next, second heat treatment is performed in an inert gas atmosphere or an oxygen gas atmosphere (preferably at 200 to 400° C., e.g. 250 to 350° C.). For example, the second heat treatment is performed in a nitrogen atmosphere at 250° C. for one hour. The second heat treatment can reduce variations in electric characteristics of the nonvolatile memory element.

In the case where the nonvolatile memory element 401 is manufactured in such a manner, the hydrogen concentration of the oxide semiconductor layer 407 is less than or equal to $5 \times 10^{19}/cm^3$, and the off-current of the nonvolatile memory element 401 is less than or equal to $1 \times 10^{-13}$ A. The carrier concentration of the oxide semiconductor layer 407 is less than $1 \times 10^{14}/cm^3$. For example, the carrier concentration of the oxide semiconductor layer 407 is less than $6.0 \times 10^{10}/cm^3$. As described above, the oxide semiconductor layer 407 which is highly purified by sufficient reduction in the hydrogen concentration is employed, so that the nonvolatile memory element 401 with excellent characteristics can be obtained.

Note that silicon carbide (e.g., 4H—SiC) is given as a semiconductor material which can be compared with an oxide semiconductor. An oxide semiconductor and 4H—SiC have some things in common. The carrier density is one of them. In accordance with Fermi-Dirac distribution at a normal temperature, the density of minority carriers in an oxide semiconductor is estimated to be approximately $10^{-7}/cm^3$. This value of the minority carrier density is extremely small similarly to that in 4H—SiC, $6.7 \times 10^{-11}/cm^3$. When the minority carrier density of an oxide semiconductor is compared with the intrinsic carrier density of silicon (approximately $1.4 \times 10^{10}/cm^3$), it can be understood well that the minority carrier density of an oxide semiconductor is significantly low.

Further, the energy band gap of an oxide semiconductor is 3.0 eV to 3.5 eV and the energy band gap of 4H—SiC is 3.26 eV, for example.

Thus, an oxide semiconductor and silicon carbide are similar in that they are both wide-gap semiconductors.

On the other hand, there is a major difference between an oxide semiconductor and silicon carbide, that is, the process temperature. Since heat treatment for activation at 1500° C. to 2000° C. is usually needed in a semiconductor process using silicon carbide, it is difficult to form a stack of silicon carbide and a semiconductor element formed using a semiconductor material other than silicon carbide. This is because a semiconductor substrate, the semiconductor element, or the like is damaged at such high temperatures. Meanwhile, an oxide semiconductor can be formed with heat treatment at 300° C. to 500° C. (the glass transition temperature or lower, up to about 700° C.); therefore, it is possible to form an integrated circuit with the use of a semiconductor material other than an oxide semiconductor and then to form a semiconductor element including an oxide semiconductor.

In addition, in contrast to silicon carbide, an oxide semiconductor is advantageous because a low heat-resistant substrate such as a glass substrate can be used. Moreover, an oxide semiconductor does not need to be subjected to heat treatment at high temperature, so that energy cost can be reduced sufficiently as compared to silicon carbide, which is another advantage.

Although a lot of researches on properties of an oxide semiconductor such as density of state (DOS) have been conducted, they do not include the idea of sufficiently reducing the DOS itself in the energy gap. According to one embodiment of the present invention, a highly purified oxide semiconductor is formed by removing water or hydrogen which might affect the DOS. This is based on the idea that the DOS itself is sufficiently reduced. Such a highly purified oxide semiconductor enables fabrication of very excellent industrial products.

Further, it is also possible to form a more highly purified (i-type) oxide semiconductor by supplying oxygen to a dangling bond of metal which is generated by oxygen vacancy and reducing the DOS due to the oxygen vacancy. For example, an oxygen-excess oxide film is formed in close contact with a channel formation region and then oxygen is supplied to the channel formation region from the oxide film, so that the DOS due to oxygen vacancy can be reduced.

A defect of an oxide semiconductor is said to be attributed to a level of 0.1 to 0.2 eV under the conduction band due to excessive hydrogen, a deep level due to shortage of oxygen, or the like. Thorough removal of hydrogen and sufficient supply of oxygen for elimination of such a defect are right as a technological thought.

An oxide semiconductor is generally considered as an n-type semiconductor; however, according to one embodiment of the present invention, an i-type semiconductor is realized by removing impurities, particularly water and hydrogen. In this respect, it can be said that one embodiment of the disclosed invention includes a novel technical idea because it is different from an i-type semiconductor such as silicon added with an impurity.

Here, an example in which the nonvolatile memory element using the oxide semiconductor layer is manufactured using a bottom-gate nonvolatile memory transistor is described. However, one embodiment of the present invention is not limited thereto, and alternatively, a top-gate nonvolatile memory transistor may be used.

⟨Relation between Vacuum Level, Work Function of Metal ($\phi_M$), and Electron Affinity ($\chi$) of an Oxide Semiconductor⟩

Figure 4:
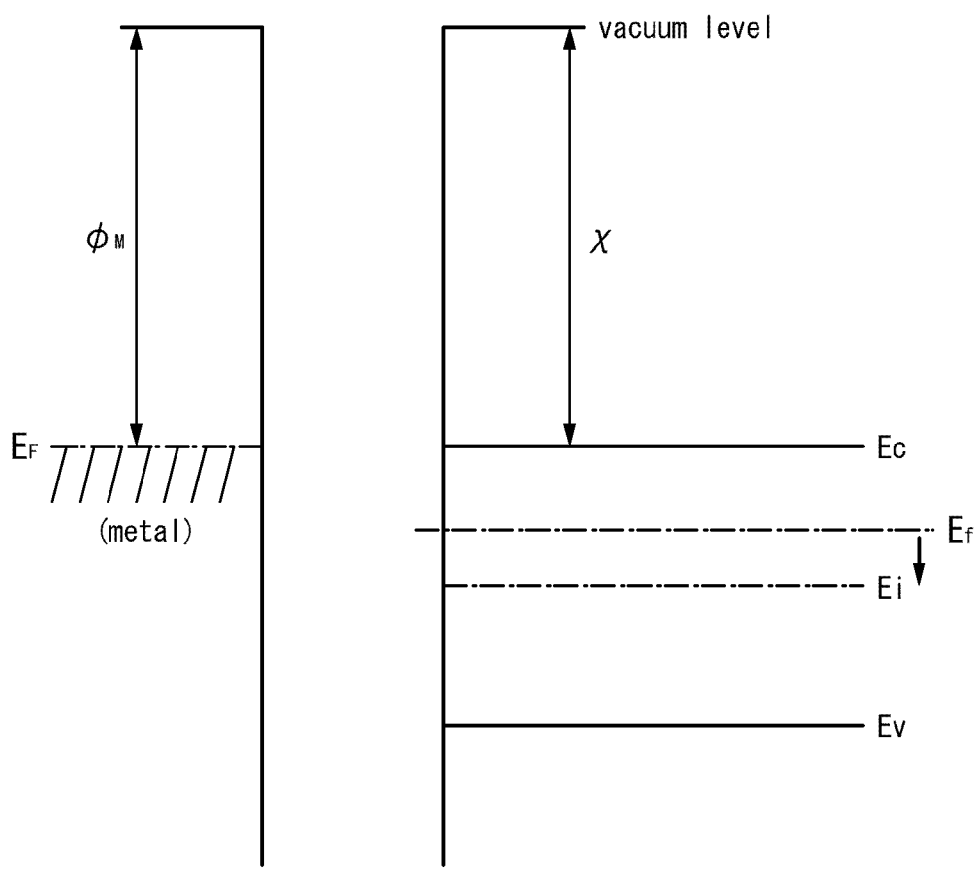
FIG. 4 illustrates a relation between a vacuum level and a work function of metal ($\phi_M$) and a relation between the vacuum level and electron affinity ($\chi$) of an oxide semiconductor.

FIG. 4 illustrates the relation between the vacuum level, the work function of metal ($\phi_M$), and the electron affinity of an oxide semiconductor ($\chi$).

Metal degenerates and the Fermi level exists in the conduction band. Meanwhile, a conventional oxide semiconductor is n-type, and the Fermi level ($E_f$) is distant from the intrinsic Fermi level ($E_i$) in the center of the band gap and is located near the conduction band. It is known that hydrogen in an oxide semiconductor is a donor and is one of the causes to produce an n-type oxide semiconductor In contrast, an oxide semiconductor according to one embodiment of the present invention is an oxide semiconductor that is made to be intrinsic (i-type) or to be close to intrinsic in the following manner: hydrogen, which is the cause to produce an n-type oxide semiconductor, is removed from the oxide semiconductor for high purification, so that the oxide semiconductor includes an element (impurity element) other than the main component of the oxide semiconductor as little as possible. That is, a feature of an embodiment of the present invention is that an oxide semiconductor is made to be or be close to a highly purified i-type (intrinsic) semiconductor not by addition of an impurity element but by elimination of impurities such as hydrogen and water. Thus, the Fermi level ($E_f$) can be comparable with the intrinsic Fermi level ($E_i$).

In the case where the band gap ($E_g$) of an oxide semiconductor is 3.15 eV, the electron affinity ($\chi$) thereof is said to be 4.3 eV.

The work function of titanium (Ti) contained in a source electrode or a drain electrode is substantially equal to the electron affinity ($\chi$) of an oxide semiconductor.

In this case, a Schottky barrier against an electron is not formed at the interface between metal and an oxide semiconductor.

In such a manner, the oxide semiconductor layer becomes intrinsic (an i-type semiconductor) or substantially intrinsic by being highly purified so as to contain an element other than its main element (i.e., an impurity element) as little as possible. Thus, characteristics of the interface between the oxide semiconductor and the gate insulating layer become obvious. For that reason, the gate insulating layer needs to form a favorable interface with the oxide semiconductor. Specifically, it is preferable to use the following insulating layer, for example: an insulating layer formed by a CVD method using high-density plasma generated with a power supply frequency in the range of the VHF band to the microwave band, or an insulating layer formed by a sputtering method.

When the interface between the oxide semiconductor and the gate insulating layer is made favorable and the oxide semiconductor is highly purified, in the case where the channel width W is $1\times10^4$ µm and the channel length L is 3 µm, for example, it is possible to realize an off-current of $10^{-13}$ A or less at a normal temperature.

⟨Principle of Operation of Device Including Nonvolatile Memory Element⟩

Writing, holding, reading, and erasing (initialization) of information (data) of a nonvolatile memory element provided with a charge accumulation layer capable of accumulating charges for a long time will be described.

Writing of information is conducted by change of the amount of charge accumulated in the charge accumulation layer. For example, in the case of an n-channel nonvolatile memory element, writing is conducted by injection of electrons into the charge accumulation layer, and erasing is conducted by extraction of electrons from the charge accumulation layer. The injection of electrons into the charge accumulation layer and extraction of electrons from the charge accumulation layer are carried out utilizing F-N (Fowler-Nordheim) tunnel current. Here, in the case where an F-N tunneling current is used in an n-channel nonvolatile memory element, a method of writing and erasing of information of the nonvolatile memory element will be described.

Writing of information is conducted in such a manner that a high potential of positive polarity (e.g., 10 V to 20 V) is applied to the control gate of the nonvolatile memory element and potentials (e.g., 0 V) lower than the potential of the control gate are applied to the source electrode and the drain electrode. Thus, high electric field is formed between the control gate and the oxide semiconductor layer, an F-N tunneling current is generated between the oxide semiconductor layer and the charge accumulation layer. Electrons are injected from the oxide semiconductor layer into the charge accumulation layer by the F-N tunneling current. The charge accumulation layer is electrically insulated from its periphery by being surrounded by an insulator; thus, the charge accumulation layer has a feature in that charges such as electrons injected into the charge accumulation layer are held.

While electrons are held in the charge accumulation layer, the threshold voltage of the nonvolatile memory element shifts in the positive direction. This state can be regarded as a state in which data of "0" is stored, for example.

At erasing of information, for example, a high potential of negative polarity (e.g., −10 V to −20 V) is applied to the control gate and potentials (e.g., 0 V) higher than the potential of the control gate are applied to the source electrode and the drain electrode. An F-N tunneling current flows between the charge accumulation layer and the oxide semiconductor layer, or between the charge accumulation layer and the source or drain electrode; thus, electrons can be extracted from the charge accumulation layer.

When the electrons are extracted from the charge accumulation layer, the threshold voltage of the nonvolatile memory element shifts in the negative direction and the nonvolatile memory element returns to a state where the threshold voltage is low. This state can be regarded as a state in which data of "1" is stored, for example.

Here, in the nonvolatile memory element 401 including the oxide semiconductor layer according to one embodiment of the present invention, when seen from the above, the source electrode and/or the drain electrode preferably include/includes a portion overlapping with the charge accumulation layer with the second insulating film provided therebetween. In other words, it is preferable that only the second insulating film be provided between the source electrode and the charge accumulation layer and/or between the drain electrode and the charge accumulation layer, without the oxide semiconductor layer. That is, the source electrode and/or the drain electrode preferably include/includes a portion in contact with the second insulating film, and in the portion in contact with the second insulating film, the source electrode and/or the drain electrode include/includes a portion overlapping with the charge accumulation layer with the second insulating film provided therebetween. In order to employ such a structure, the charge accumulation layer is preferably formed so as to have a portion which does not overlap with the oxide semiconductor layer, when seen from the above, as illustrated in a plan view of FIG. 1A.

In such a structure, an F-N tunneling current can flow between the charge accumulation layer and the source electrode or between the charge accumulation layer and the drain electrode; thus, extraction of electrons can be performed from the charge accumulation layer directly to the source or drain electrode. As a result, erasing of information can be conducted at a low voltage.

Note that when the extraction of electrons is performed from the charge accumulation layer to the source or drain electrode through the second insulating film and the oxide semiconductor layer, a high erasing voltage might be needed as compared with the erasing voltage in the case where the extraction of electrons is performed through only the second insulating film. This is because, even when a potential of negative polarity is applied to the control gate of the nonvolatile memory element including the oxide semiconductor layer according to one embodiment of the present invention, the oxide semiconductor layer might serve as an insulator.

Therefore, in the nonvolatile memory element 401 including the oxide semiconductor layer according to one embodiment of the present invention, it is very useful for low voltage operation of the nonvolatile memory element 401 to employ the structure in which the source electrode and/or the drain electrode include/includes a portion which overlaps with the charge accumulation layer with the second insulating film provided therebetween.

The amount of charges of an F-N tunneling current which is generated by writing and erasing depends on the thickness of the second insulating film of the nonvolatile memory element. An F-N tunneling current is easily generated due to quantum effect as the thickness of the second insulating film is smaller, whereas hardly generated as the thickness of the second insulating film is larger. Therefore, in a region that can serve as a path where charge is injected to or extracted from the charge accumulation layer by a writing operation or an erasing operation, the second insulating film between the charge accumulation layer and the oxide semiconductor layer, or between the charge accumulation layer and the source or drain electrode is formed thin so that the charges can pass therethrough. However, in order to hold information in the nonvolatile memory element, the second insulating film needs to be thick enough so that the charges do not leak from the charge accumulation layer.

A reading voltage (a potential of positive polarity) is applied to the control gate and a current which flows in the nonvolatile memory element is observed; thus, reading of information (data) can be conducted. When a current hardly flows in the nonvolatile memory element by application of a reading voltage (a potential of positive polarity), data of "0" is stored. When a large amount of current flows in the nonvolatile memory element by the application, data of "1" is stored.

This embodiment can be freely combined with any of the other embodiments.

(Embodiment 2)

Figure 5A:
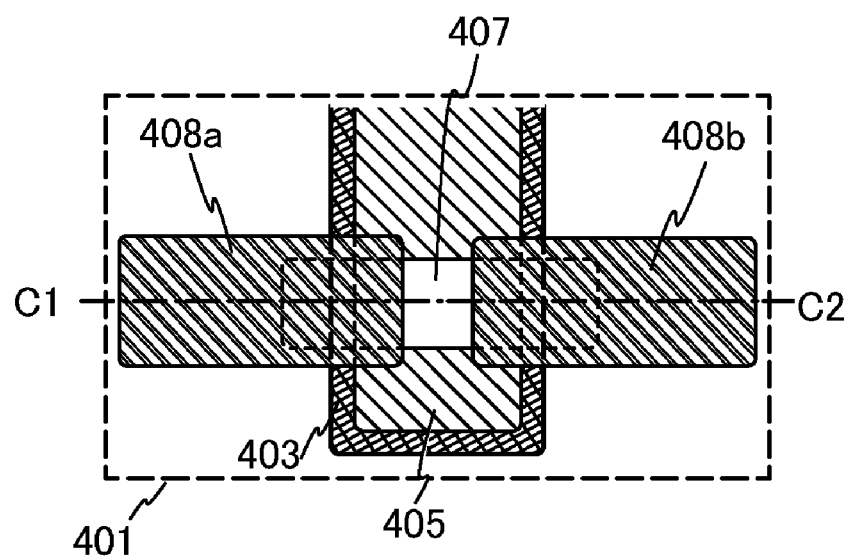
FIGS. 5A and 5B illustrate an example of a plan view and a cross-sectional view of a device including a nonvolatile memory element.
Figure 5B:
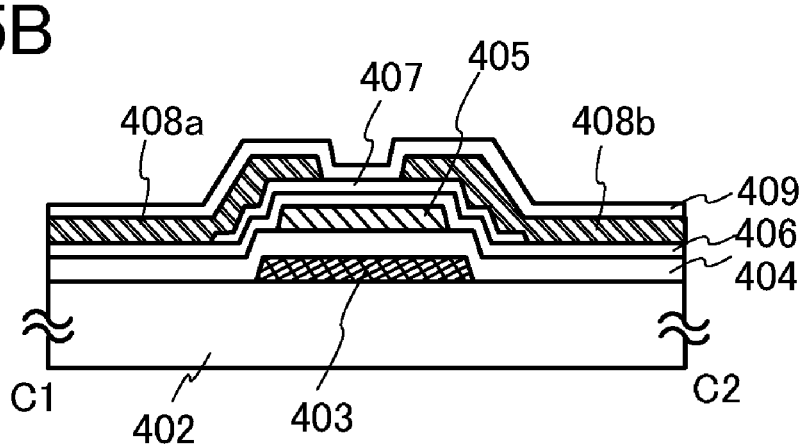

In this embodiment, a structure, which is different from the structure of FIGS. 1A and 1B, of a device including the nonvolatile memory element according to one embodiment of the present invention will be described with reference to FIGS. 5A and 5B. FIG. 5A is a plan view of the nonvolatile memory element and FIG. 5B is a cross-sectional view thereof. FIG. 5B corresponds to a cross-sectional view taken along line C1-C2 in FIG. 5A.

FIGS. 5A and 5B illustrate an example in which the pattern shape of the oxide semiconductor layer 407 is different from that of FIGS. 1A and 1B. The other structures are the same or substantially the same as the structures of FIGS. 1A and 1B; thus, description thereof is omitted.

In this embodiment, the oxide semiconductor layer 407 is provided so that the width of the oxide semiconductor layer 407 is larger than the width of the charge accumulation layer 405 in a channel length direction (a direction along line C1-C2). Thus, the widths of the control gate 403 and the charge accumulation layer 405 in the channel length direction can be small as compared with the device including the nonvolatile memory element illustrated in FIGS. 1A and 1B. Accordingly, the element can be reduced in size, leading to high integration.

In a channel width direction, the width of the source electrode 408a and/or the width of the drain electrode 408b are/is preferably larger than the width of the oxide semiconductor layer 407. Accordingly, in the channel width direction, the source electrode 408a and/or the drain electrode 408b can be formed so as to include a portion overlapping with the charge accumulation layer 405 with the second insulating film 406 provided therebetween. Here, widths of both the source electrode 408a and the drain electrode 408b are larger than the width of the oxide semiconductor layer 407 in the channel width direction.

In such a structure, an F-N tunneling current can flow between the charge accumulation layer 405 and the source electrode 408a and between the charge accumulation layer 405 and the drain electrode 408b; thus, extraction of electrons can be performed from the charge accumulation layer 405 directly to the source electrode 408a and the drain electrode 408b. As a result, erasing of information can be conducted at a low voltage, leading to a low-voltage operation of the nonvolatile memory element 401.

This embodiment can be freely combined with any of the other embodiments.

(Embodiment 3)

Figure 6A:
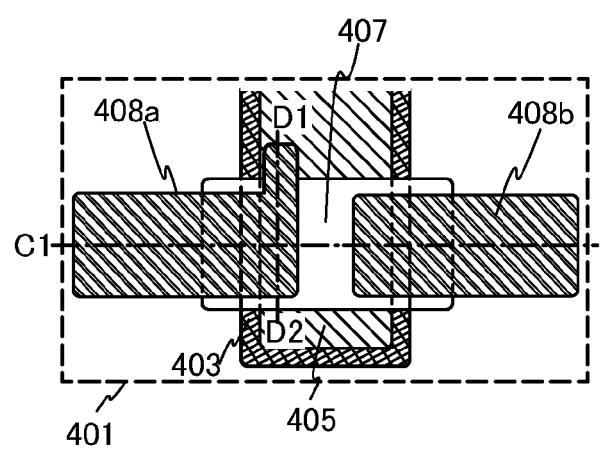
FIGS. 6A to 6C illustrate an example of a plan view and a cross-sectional view of a device including a nonvolatile memory element.
Figure 6C:
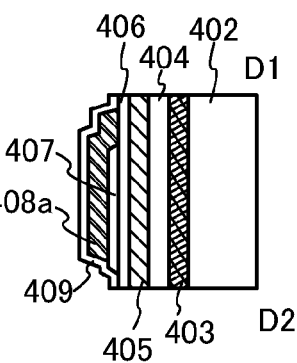
Figure 6B:
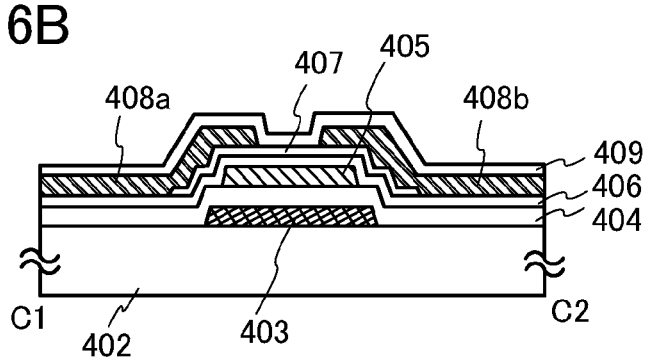

In this embodiment, a structure, which is different from the structure of FIGS. 1A and 1B, of a device including the nonvolatile memory element according to one embodiment of the present invention will be described with reference to FIGS. 6A to 6C. FIG. 6A is a plan view of the nonvolatile memory element and FIGS. 6B and 6C are each a cross-sectional view thereof. FIG. 6B corresponds to a cross-sectional view taken along line C1-C2 in FIG. 6A. FIG. 6C corresponds to a cross-sectional view taken along line D1-D2 in FIG. 6A.

FIGS. 6A to 6C illustrate an example in which the pattern shapes of the oxide semiconductor layer 407 and the source electrode 408a are different from those of FIGS. 1A and 1B. The other structures are the same or substantially the same as the structures of FIGS. 1A and 1B; thus, description thereof is omitted.

The oxide semiconductor layer 407 is provided so that the width of the oxide semiconductor layer 407 is larger than the width of the charge accumulation layer 405 in a channel length direction (a direction along line C1-C2).

At least part of the width of the source electrode 408a and/or the width of the drain electrode 408b is larger than the width of the oxide semiconductor layer 407 in a channel width direction (a direction along line D1-D2). Accordingly, in the channel width direction, the source electrode 408a and/or the drain electrode 408b can be formed so as to include a portion overlapping with the charge accumulation layer 405 with the second insulating film 406 provided therebetween. The overlapped portion is preferably in the region where the charge accumulation layer 405 is provided, without covering an end portion of the charge accumulation layer 405. Thus, the overlapped portion of the source electrode 408a and/or the drain electrode 408b do not cover the end portion of the charge accumulation layer 405 with the second insulating film 406 provided therebetween. Further, the thickness of the second insulating film 406 between the source electrode 408a and the charge accumulation layer 405 and/or between the drain electrode 408b and the charge accumulation layer 405 is stable. Therefore, variations in erasing voltage can be reduced.

Here, the width of part of the source electrode 408a is larger than the width of the oxide semiconductor layer 407 in the channel width direction. Although the pattern shape of the source electrode 408a is an L-shape here, one embodiment of the present invention is not limited thereto. The pattern shape of the source electrode 408a may be T-shape or another shape. The source electrode 408a has another shape here; instead of that, the drain electrode 408b may have another shape or both the source electrode 408a and the drain electrode 408b may each have another shape.

In such a structure, an F-N tunneling current can flow between the charge accumulation layer and the source or between the charge accumulation layer and the drain electrode; thus, extraction of electrons can be performed from the charge accumulation layer directly to the source or drain electrode. As a result, erasing of information can be conducted at a low voltage and thus the nonvolatile memory element 401 can be operated at a low voltage.

This embodiment can be freely combined with any of the other embodiments.

(Embodiment 4)

Figure 7A:
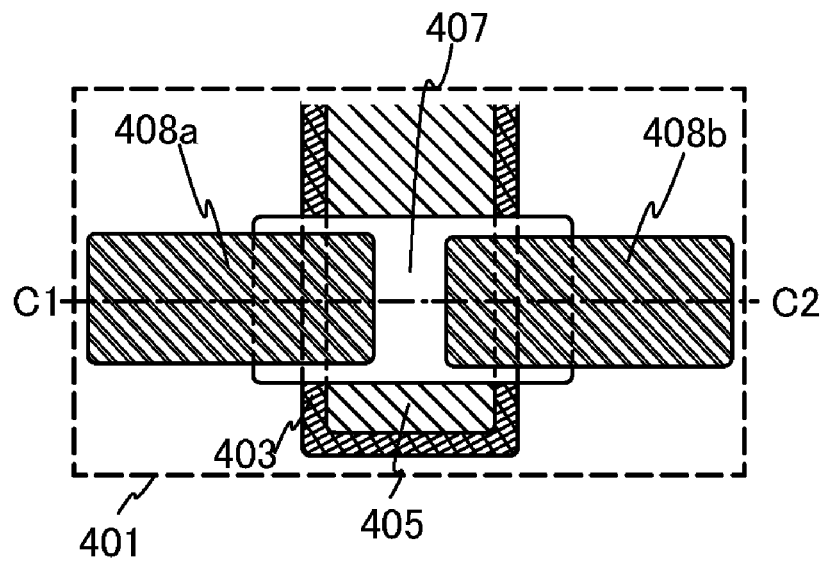
FIGS. 7A and 7B illustrate an example of a plan view and a cross-sectional view of a device including a nonvolatile memory element.
Figure 7B:
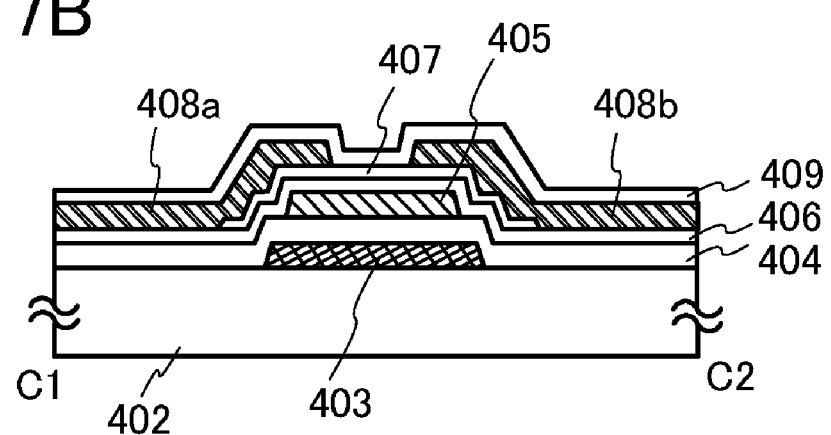

In this embodiment, a structure, which is different from the structure of FIGS. 1A and 1B, of a device including the nonvolatile memory element according to one embodiment of the present invention will be described with reference to FIGS. 7A and 7B. FIG. 7A is a plan view of the nonvolatile memory element and FIG. 7B is a cross-sectional view thereof. FIG. 7B corresponds to a cross-sectional view taken along line C1-C2 in FIG. 7A.

FIGS. 7A and 7B illustrate an example in which the pattern shapes of the oxide semiconductor layer 407 and the source electrode 408a are different from those of FIGS. 1A and 1B. The other structures are the same or substantially the same as the structures of FIGS. 1A and 1B; thus, description thereof is omitted.

The oxide semiconductor layer 407 is provided so that the width of the oxide semiconductor layer 407 is larger than the width of the charge accumulation layer 405 in a channel length direction (a direction along line C1-C2). Thus, the widths of the control gate 403 and the charge accumulation layer 405 in the channel length direction can be small as compared with the device including the nonvolatile memory element illustrated in FIGS. 1A and 1B. Accordingly, the element can be reduced in size, leading to high integration.

The oxide semiconductor layer 407 is provided so that the width of the oxide semiconductor layer 407 is larger than the width of the charge accumulation layer 405 in the channel width direction.

This embodiment can be freely combined with any of the other embodiments.

(Embodiment 5)

Figure 8A:
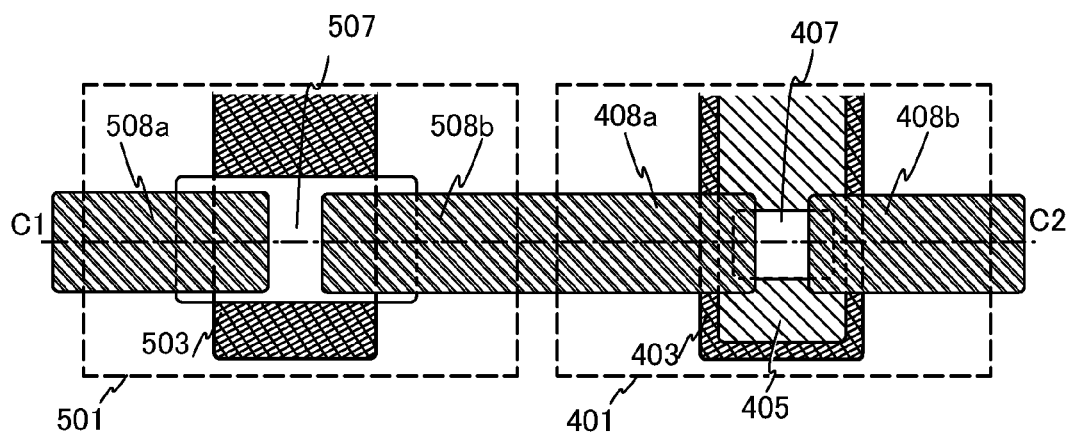
FIGS. 8A and 8B illustrate an example of a plan view and a cross-sectional view of a device including a nonvolatile memory element and a transistor.
Figure 8B:
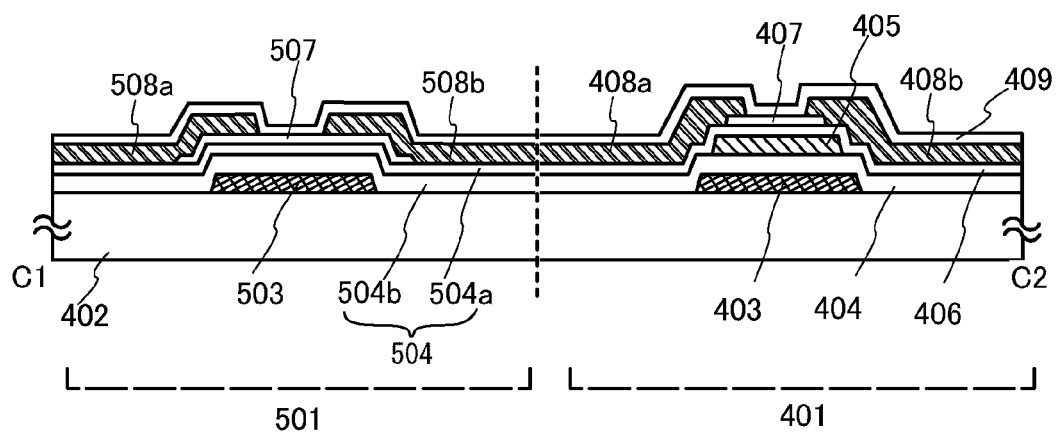

In this embodiment, a structure of a device including the nonvolatile memory element and a transistor according to one embodiment of the present invention will be described with reference to FIGS. 8A and 8B. FIG. 8A is a plan view of a device including the nonvolatile memory element and a transistor and FIG. 8B is a cross-sectional view thereof. FIG. 8B corresponds to a cross-sectional view taken along line C1-C2 in FIG. 8A.

The nonvolatile memory element 401 includes the control gate 403 provided over the substrate 402, the first insulating film 404 which overlaps with the control gate 403, the charge accumulation layer 405 in contact with the first insulating film 404, the second insulating film 406 which overlaps with the charge accumulation layer 405, the oxide semiconductor layer 407 which overlaps with the second insulating film 406, and the source electrode 408a and the drain electrode 408b which are electrically connected to the oxide semiconductor layer 407. The charge accumulation layer 405 is provided between the oxide semiconductor layer 407 and the control gate 403.

The charge accumulation layer 405 is provided so as to overlap with the channel formation region included in the oxide semiconductor layer 407 with the second insulating film 406 provided therebetween. Further, the charge accumulation layer 405 is provided so as to overlap with the control gate 403 with the first insulating film 404 provided therebetween.

A transistor 501 includes a gate electrode 503 provided over the substrate 402, a third insulating film 504 which overlaps with the gate electrode 503, an oxide semiconductor layer 507 which overlaps with the third insulating film 504, and a source electrode 508a and a drain electrode 508b which are electrically connected to the oxide semiconductor layer 507. Here, as the third insulating film 504, a stacked film of a first insulating layer 504a and a second insulating layer 504b is used; however, one embodiment of the present invention is not limited thereto. One of the first insulating layer 504a and the second insulating layer 504b can be used. Alternatively, part of the first insulating layer 504a and/or part of the second insulating layer 504b can be used.

The transistor 501 and the nonvolatile memory element 401 may be electrically connected to each other or may be electrically separated from each other. Here, as illustrated in FIGS. 8A and 8B, the drain electrode 508b included in the transistor 501 and the source electrode 408a included in the nonvolatile memory element 401 are electrically connected to each other.

The nonvolatile memory element 401 can be formed in steps that are the same or substantially the same as manufacturing steps described in Embodiment 1. The nonvolatile memory element 401 can have a structure that is the same or substantially the same as the structure described in Embodiment 1. Further, instead of the structure described in Embodiment 1, the nonvolatile memory element 401 may have a structure the same or substantially the same as that in any of Embodiments 2 to 4. The transistor 501 can be formed using a material, a film, and a layer which are the same as those of the nonvolatile memory element 401.

The gate electrode 503 included in the transistor 501 can be formed using the same material over the same layer in the same step as the control gate 403 included in the nonvolatile memory element 401. The first insulating layer 504a of the third insulating film 504 included in the transistor 501 can be formed using the same material over the same layer in the same step as the second insulating film 406 included in the nonvolatile memory element 401. The second insulating layer 504b of the third insulating film 504 included in the transistor 501 can be formed using the same material over the same layer in the same step as the first insulating film 404 included in the nonvolatile memory element 401. The oxide semiconductor layer 507 included in the transistor 501 can be formed using the same material over the same layer in the same step as the oxide semiconductor layer 407 included in the nonvolatile memory element 401. The source electrode 508a and the drain electrode 508b included in the transistor 501 can be formed using the same material over the same layer in the same step as the source electrode 408a and the drain electrode 408b included in the nonvolatile memory element 401.

The oxide insulating film 409 is provided above the nonvolatile memory element 401 and the transistor 501.

As described above, the nonvolatile memory element 401 and the transistor 501 can be formed over one substrate, using the same material, film, and layer in the same steps. The transistor 501 manufactured in the same steps as the nonvolatile memory element 401 has a favorable off-current characteristics.

As one embodiment of the present invention, in a memory circuit including a memory cell formed using a selection transistor and a nonvolatile memory element, the transistor 501 can be used as a selection transistor. In that case, the off-current of the selection transistor using an oxide semiconductor is extremely small; thus, the leakage current of a non-selected memory cell can be extremely small, leading to a stable reading operation. Moreover, the number of memory cells which are connected to one bit line can be increased; therefore, a device including a nonvolatile memory element which is suitable for large capacity can be realized.

As another embodiment of the present invention, the transistor 501 can be used as a pixel transistor in a display device. In that case, the off-current of the pixel transistor using an oxide semiconductor is extremely small; thus, the storage capacitor can be small, leading to improvement in an aperture ratio. Alternatively, the frame frequency can be decreased when a still image is displayed or a driver circuit can be temporarily stopped, leading to a reduction in power consumption. In that case, the embodiment of the present invention is particularly useful because a nonvolatile memory element can be formed at the same time as the pixel transistor over a TFT substrate used for the display device.

This embodiment can be freely combined with any of the other embodiments.

(Embodiment 6)

Figure 9:
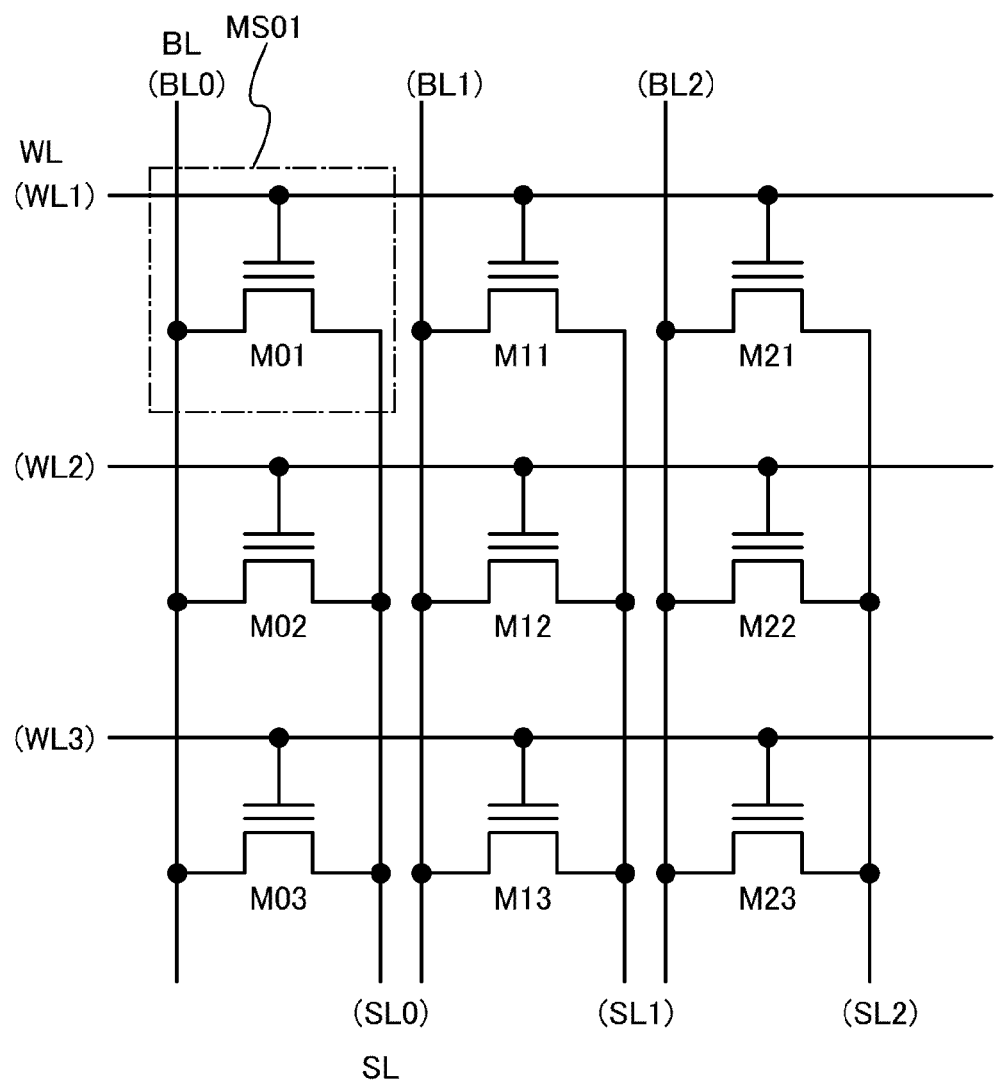
FIG. 9 is a diagram showing an example of an equivalent circuit of a nonvolatile memory cell array.
Figure 9:
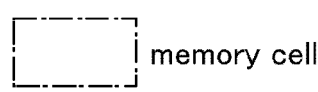

In this embodiment, a structure in which memory cells each including a nonvolatile memory element according to one embodiment of the present invention are arranged in matrix will be described with reference to an equivalent circuit of FIG. 9. FIG. 9 illustrates an example of an equivalent circuit of a memory cell array in which memory cells each including a nonvolatile memory element are arranged in matrix.

FIG. 9 illustrates a NOR-type equivalent circuit in which a nonvolatile memory element M01 is directly connected to one bit line. In this memory cell array, word lines WL and bit lines BL are disposed to intersect with each other, and a nonvolatile memory element is disposed at each intersection. In the NOR-type equivalent circuit, a drain electrode of each nonvolatile memory element is electrically connected to one bit line BL. A source electrode of each nonvolatile memory element is electrically connected to a source line SL. A control gate of each nonvolatile memory element is electrically connected to a word line WL.

In a memory cell MS01, the nonvolatile memory element M01 is formed of an island-shaped oxide semiconductor layer obtained by separating an oxide semiconductor layer over an insulating surface, whereby interference with other nonvolatile memory elements can be prevented without particularly providing an element separation region.

The NOR-type equivalent circuit operates, for example, as follows. The case where an n-channel element is used for the nonvolatile memory element M01 will be described as an example. Data (information) is written in such a manner that a high voltage (e.g., 15 V) is applied to the word line WL which is selected for data writing, and potentials corresponding to data of "0" and data of "1" are applied to the bit line BL and the source line SL. For example, a low potential (e.g., 0 V) and a high potential (e.g., 7 V) for data of "0" and data of "1", respectively, are applied to the bit line BL and the source line SL. In a nonvolatile memory element to which the low potential is applied for writing data of "0", the F-N tunneling current flows from the channel formation region to the charge accumulation layer and electrons are injected to the charge accumulation layer. The F-N tunneling current is not generated in the case of writing data of "0".

When data is erased, by application of a voltage of positive polarity of approximately 10 V to the source line SL and the bit line BL and application of a high voltage of negative polarity to the word line WL (by application of a high voltage of negative polarity to the control gate), electrons are extracted from the charge accumulation layer. Accordingly, the data of "1" is erased.

When data is read, the source line SL is set to 0 V; a reading circuit connected to the bit line BL is operated; a reading voltage, which is set to the intermediate value between the threshold voltage of data of "0" and the threshold voltage of data of "1", is applied to a selected word line WL; and a sense amplifier included in the reading circuit determines whether a current flows in the nonvolatile memory element or not.

The structure in this embodiment has an advantage that the leakage current of the non-selected memory cell is small because the off-current of the nonvolatile memory element using an oxide semiconductor is extremely small. As a result, in the reading operation, the leakage current of the bit line BL is extremely small; thus, a stable operation can be realized. Moreover, since the leakage current of the bit line BL is extremely small, the number of memory cells which are connected to one bit line can be increased; therefore, a device including a nonvolatile memory element which is suitable for large capacity can be realized.

This embodiment can be freely combined with any of the other embodiments.

(Embodiment 7)

Figure 10:
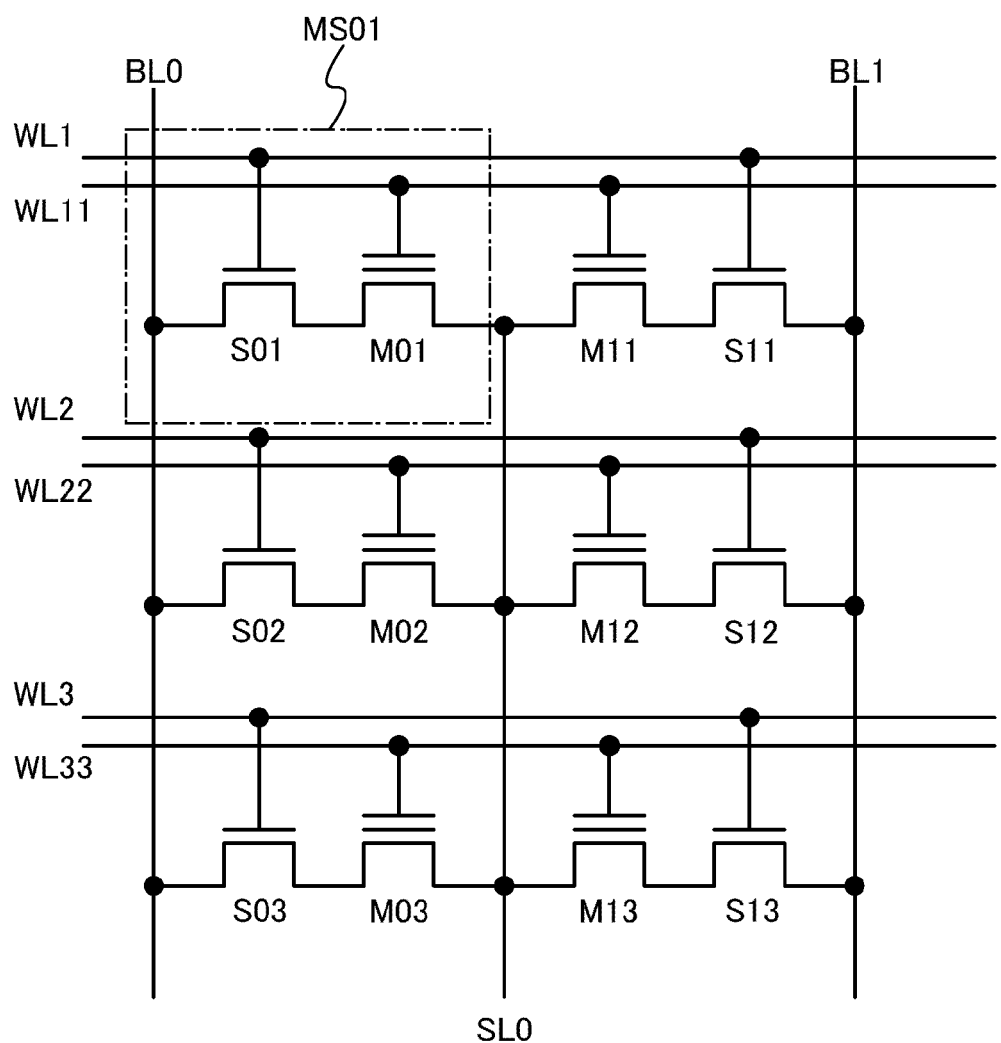
FIG. 10 is a diagram showing an example of an equivalent circuit of a nonvolatile memory cell array.
Figure 10:
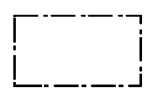

In this embodiment, a structure in which memory cells each including a nonvolatile memory element according to one embodiment of the present invention are arranged in matrix will be described with reference to an equivalent circuit of FIG. 10. FIG. 10 illustrates an example of an equivalent circuit of memory cell array in which memory cells each including a nonvolatile memory element are arranged in matrix.

A memory cell MS01 which stores one bit of information includes a selection transistor S01 and a nonvolatile memory element M01 The selection transistor S01 is connected in series between the bit line BL0 and the nonvolatile memory element M01 A source electrode of the selection transistor S01 is electrically connected to a drain electrode of the nonvolatile memory element M01. A gate of the selection transistor S01 is connected to a word line WL1. A drain electrode of the selection transistor S01 is electrically connected to the bit line BL0. A source electrode of the nonvolatile memory element M01 is electrically connected to a source line SL0. A control gate of the nonvolatile memory element M01 is electrically connected to a word line WL11.

The memory cell operates, for example, as follows. The case where an n-channel element is used for each of the selection transistor S01 and the nonvolatile memory element M01 will be described as an example. When data (information) is written in the nonvolatile memory element M01, an H-level voltage (e.g., 2 V) is applied to the word line WL1, an L level (e.g., 0 V) is applied to the bit line BL0, a high voltage (e.g., 5 V) is applied to the bit line BL1, and a high voltage (e.g., 15 V) is applied to the word line WL11; thus, charges are accumulated in the charge accumulation layer. In order to erase data, a high voltage (e.g., 5 V) is applied to the word line WL1 and the bit line BL0, and a high voltage of negative polarity (e.g., −10 V) is applied to the word line WL11.

In the memory cell MS01, the selection transistor S01 and the nonvolatile memory element M01 are each formed of an island-shaped oxide semiconductor layer obtained by separating an oxide semiconductor layer over an insulating surface, whereby interference with other selection transistors or nonvolatile memory elements can be prevented without particularly providing an element separation region.

The structure in this embodiment has an advantage that the leakage current of the non-selected memory cell is small because the off-current of the selection transistor and the nonvolatile memory element using an oxide semiconductor is extremely small. As a result, in the reading operation, the leakage current of the bit line BL is extremely small; thus, a stable operation can be realized. Moreover, since the leakage current of the bit line BL is extremely small, the number of memory cells which are connected to one bit line can be increased; therefore, a device including a nonvolatile memory element which is suitable for large capacity can be realized.

Further, a pixel transistor of a display device can be provided using the same material, film, and layer in the same steps over one substrate as a transistor used as the selection transistor. In that case, a memory cell array in which memory cells each including a nonvolatile memory element and a selection transistor are arranged in matrix can be formed at the same time as the pixel transistor over a TFT substrate used for a display device, which is very useful.

This embodiment can be freely combined with any of the other embodiments.

(Embodiment 8)

Figure 11:
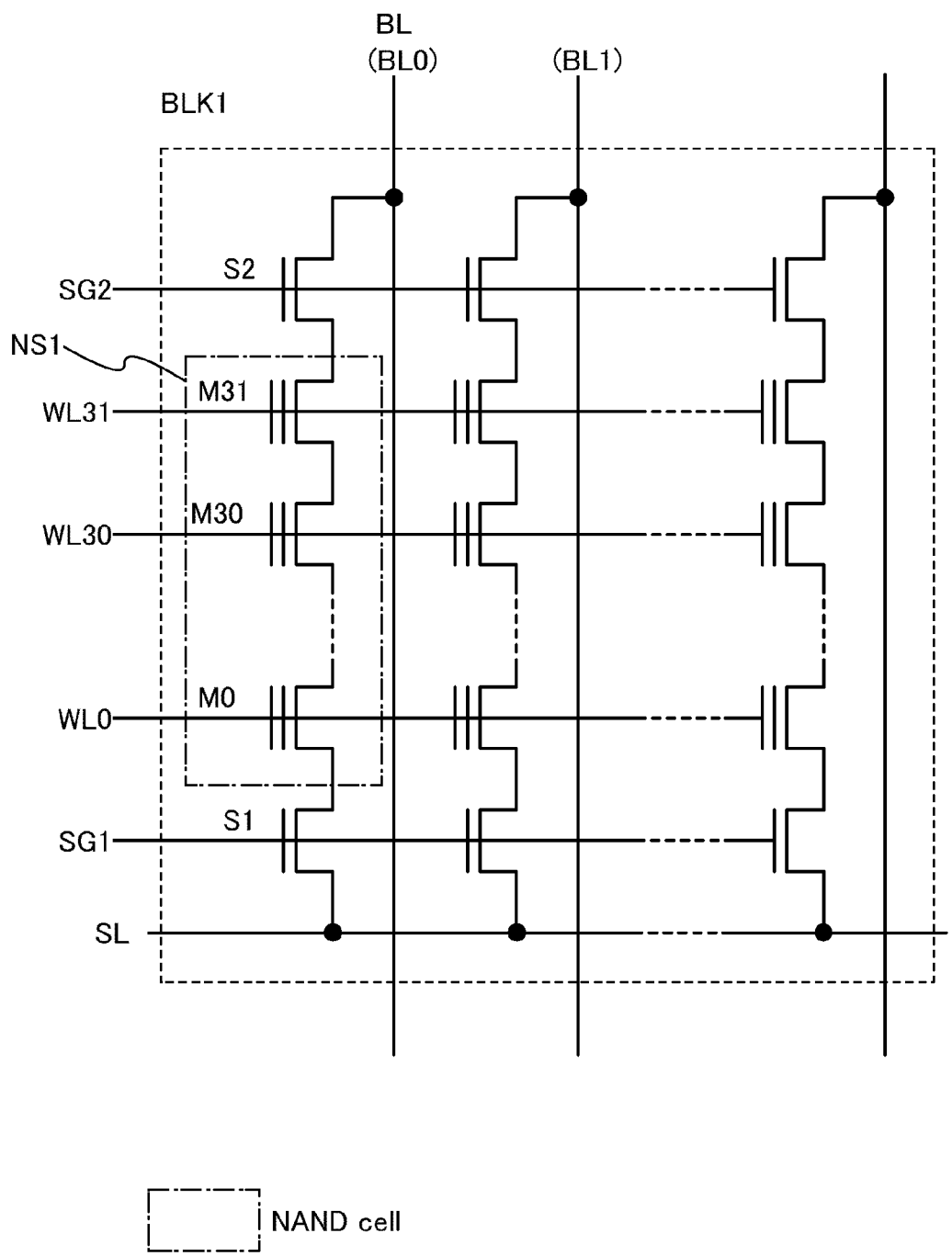
FIG. 11 is a diagram showing an example of an equivalent circuit of a nonvolatile memory cell array.

In this embodiment, a structure in which memory cells each including a nonvolatile memory element according to one embodiment of the present invention are arranged in matrix will be described with reference to an equivalent circuit of FIG. 11. FIG. 11 illustrates an example of an equivalent circuit of a memory cell array including a plurality of memory cells each including a nonvolatile memory element.

FIG. 11 shows an example of an equivalent circuit of a NAND-type memory cell array. A NAND cell NS1 in which a plurality of nonvolatile memory elements are connected in series is electrically connected to a bit line BL through a selection transistor S2. The NAND cell NS1 is electrically connected to a source line SL through a selection transistor S1. A gate of the selection transistor S1 and a gate of the selection transistor S2 are electrically connected to a selection gate line SG1 and a selection gate line SG2, respectively. Control gates of the plurality of nonvolatile memory elements are electrically connected to the respective word lines WL.

A plurality of NAND cells forms a block BLK. The number of word lines in the block BLK1 shown in FIG. 11 is 32 (word lines WL0 to WL31). Control gates of the nonvolatile memory elements provided in the same row of the block BLK1 are electrically connected to the word line corresponding to the row.

In that case, since the selection transistors S1 and S2 and nonvolatile memory elements M0 to M31 are connected in series, these may be formed using one oxide semiconductor layer as one group. Accordingly, integration can be realized. Further, adjacent NAND cells can easily be separated. The oxide semiconductor layer of the selection transistors S1 and S2 may be formed separately from the oxide semiconductor layer of the NAND cell.

The NAND cell operates, for example, as follows. After the NAND cell NS1 is made in an erasing state, in other words, after the threshold value of each nonvolatile memory element in the NAND cell NS1 is made in a negative voltage state, a writing operation is carried out. In the writing operation, a high voltage (e.g., 15 V) is applied to a selected word line, and an H-level voltage (e.g., 2 V) is applied to the selection gate line SG1 and the word line(s) arranged closer to the selection gate line SG1 side than the selected word line. As a result, charges are accumulated in the charge accumulation layer.

When an erasing operation is carried out, a high voltage of negative polarity (e.g., −10 V) is applied to the selected word line, and a high voltage (e.g., 5 V) is applied to the selection gate line SG2 and the word line(s) arranged closer to the selection gate line SG2 side than the selected word line. Thus, electrons in the charge accumulation layer are discharged to the oxide semiconductor layer due to tunnel current. As a result, threshold voltages of these memory cells shift in the negative direction.

The structure in this embodiment has an advantage that the leakage current of the non-selected memory cell is small because the off-current of the selection transistor and the nonvolatile memory element using an oxide semiconductor is extremely small. As a result, in the reading operation, the leakage current of the bit line BL is extremely small; thus, a stable operation can be realized. Moreover, since the leakage current of the bit line BL is extremely small, the number of memory cells which are connected to one bit line can be increased; therefore, a device including a nonvolatile memory element which is suitable for large capacity can be realized.

Further, a pixel transistor of a display device can be provided using the same material, film, and layer in the same steps over one substrate as a transistor used as the selection transistor. In that case, a memory cell array in which memory cells each including a nonvolatile memory element and a selection transistor are arranged in matrix can be formed at the same time as the pixel transistor over a TFT substrate used for a display device, which is very useful.

This embodiment can be freely combined with any of the other embodiments.

(Embodiment 9)

In this embodiment, an example of a display device in which a memory portion including a nonvolatile memory element and a pixel portion including a transistor are formed over one substrate will be described with reference to a circuit block diagram of FIG. 12.

A pixel portion 5301, a scan line driver circuit 5302, a signal line driver circuit 5304, and a memory portion 5303 are formed over a substrate 5300. In the pixel portion 5301, a plurality of signal lines extended from the signal line driver circuit 5304 is arranged and a plurality of scan lines extended from the scan line driver circuit 5302 is arranged. Pixels which include display elements are arranged in matrix in regions where the scan lines and the signal lines intersect with each other. The signal line driver circuit 5304 is provided with a plurality of wirings which supplies output data from the memory portion 5303. Further, the substrate 5300 of the display device is connected to a control circuit 5305 (also referred to as a controller or a control IC) through a connection portion such as a flexible printed circuit (FPC).

Figure 12:
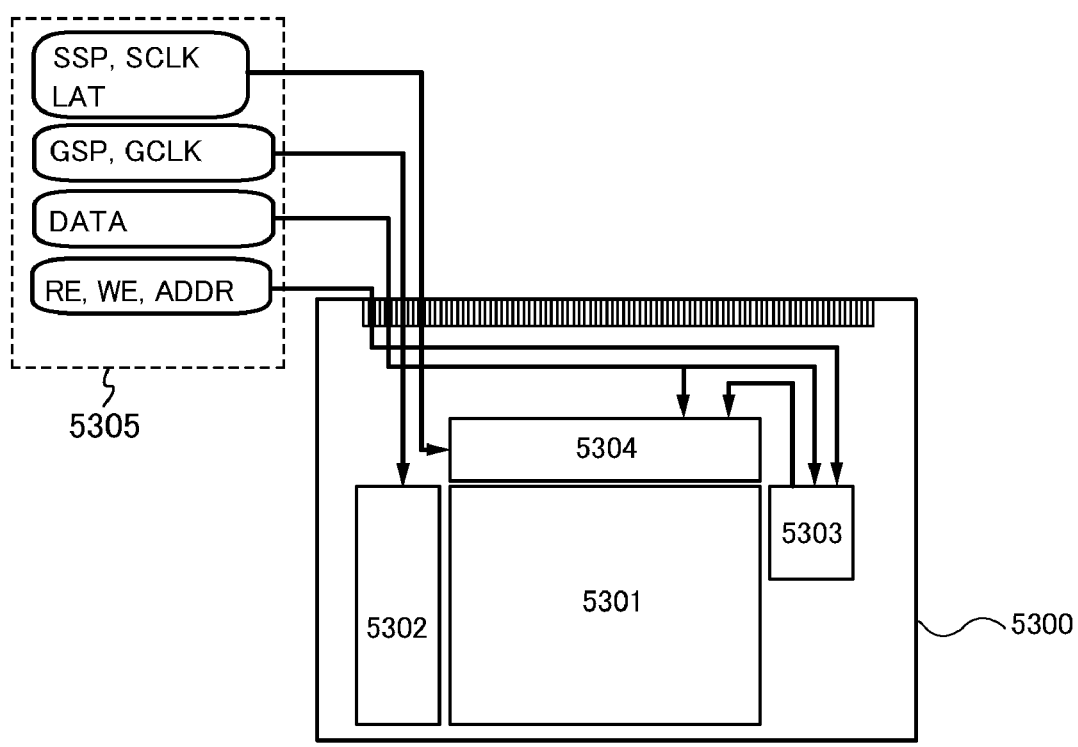
FIG. 12 is a block diagram showing an example of a circuit of a device including a nonvolatile memory element.

In FIG. 12, the scan line driver circuit 5302, the signal line driver circuit 5304, and the memory portion 5303 are formed over the substrate 5300 over which the pixel portion 5301 is formed. Accordingly, the number of components such as a drive circuit which is provided outside is reduced, so that reduction in cost can be achieved. Further, if the driver circuit is provided outside the substrate 5300, wirings would need to be extended and the number of connections of wirings would be increased, but by providing the driver circuit over the substrate 5300, the number of connections of the wirings can be reduced. Accordingly, improvement in reliability and yield can be achieved.

Note that the control circuit 5305 supplies, for example, a scan line driver circuit start signal (GSP) and a scan line driver circuit clock signal (GCLK) to the scan line driver circuit 5302. The control circuit 5305 also supplies a signal line driver circuit start signal (SSP), a signal line driver circuit clock signal (SCLK), and a latch signal (LAT) to the signal line driver circuit 5304. The control circuit 5305 supplies a video signal data (DATA) (also referred to as simply a video signal) to the signal line driver circuit 5304 and the memory portion 5303. The control circuit 5305 also supplies a read enable signal (RE), a write enable signal (WE), and an address signal (ADDR) to the memory portion 5303. Note that each signal may be a plurality of clock signals whose periods are different or may be supplied together with an inverted clock signal (CKB).

The memory portion 5303 is provided with a plurality of nonvolatile memory elements. As the nonvolatile memory element, a nonvolatile memory element using an oxide semiconductor layer can be used. As a transistor of the pixel portion, a transistor in which the oxide semiconductor layer is used as a channel formation region can be used. As the nonvolatile memory element including an oxide semiconductor layer and the transistor including an oxide semiconductor layer, those described in any of the other embodiments can be employed.

The off-current of the pixel transistor using an oxide semiconductor is extremely small; thus, the storage capacitor can be small, leading to improvement in an aperture ratio. Alternatively, the frame frequency can be decreased when a still image is displayed or a driver circuit can be temporarily stopped, leading to a reduction in power consumption. In that case, the embodiment of the present invention is particularly useful because a nonvolatile memory element can be formed at the same time as the pixel transistor over a TFT substrate used for the display device.

In addition, there is an advantage that the leakage current of the non-selected memory cell is small because the off-current of the nonvolatile memory element using an oxide semiconductor is extremely small. As a result, in the reading operation, the leakage current of the bit line BL is extremely small; thus, a stable operation can be realized. Moreover, since the leakage current of the bit line BL is extremely small, the number of memory cells which are connected to one bit line can be increased; therefore, a device including a nonvolatile memory element which is suitable for large capacity can be realized.

In particular, a structure in which a nonvolatile memory portion and a pixel portion are formed over one substrate is suitable for storing the video signal data and transferring the data rapidly to the signal line driver circuit, because a nonvolatile memory element which is suitable for large capacity and a stable reading operation is used in the nonvolatile memory portion, the length of the wiring which supplies data signal outputted from the memory portion is short, and data is transferred from the memory portion to the signal line driver circuit 5304 with little delay.

This embodiment can be freely combined with any of the other embodiments.

(Embodiment 10)

In this embodiment, examples of electronic appliances provided with a device including a nonvolatile memory element and/or a transistor obtained according to any of the above embodiments will be described with reference to FIGS. 13A to 13F. Since the off-current of a nonvolatile memory element and a transistor using an oxide semiconductor which is obtained according to any of the above embodiments is extremely small, when a device including the nonvolatile memory element or the transistor is applied to an electronic appliance of this embodiment, the power consumption can be reduced. In particular, the nonvolatile memory element using an oxide semiconductor has an advantage that the leakage current of a non-selected memory cell is small. As a result, in the reading operation, the leakage current of a bit line BL is extremely small, leading to a stable operation. Moreover, since the leakage current of the bit line BL is extremely small, the number of memory cells which are connected to one bit line can be increased; thus, a device including a nonvolatile memory element which is suitable for large capacity can be realized. Therefore, an electronic appliance with a novel structure can be provided with the use of the device including the nonvolatile memory element. A device including a nonvolatile memory element according to any of the above embodiment is integrated, mounted on a circuit substrate or the like, and placed inside an electronic appliance.

Figure 13A:
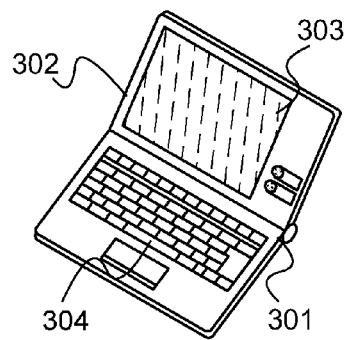
FIGS. 13A to 13F each illustrate an example of an electronic appliance provided with a device including a nonvolatile memory element.

FIG. 13A illustrates a laptop personal computer including the device including the nonvolatile memory element and/or the transistor according to the above embodiment. The laptop personal computer includes a main body 301, a housing 302, a display portion 303, a keyboard 304, and the like.

Figure 13D:
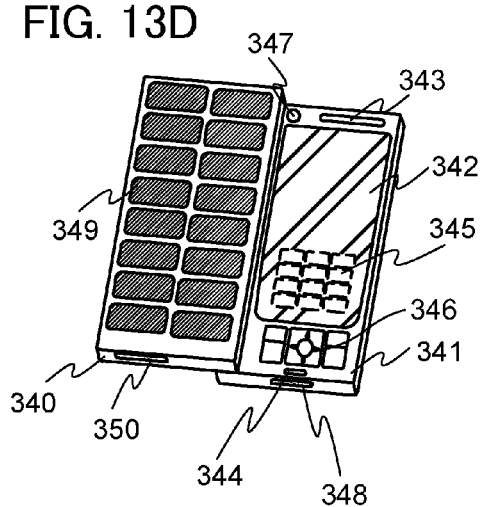
Figure 13B:
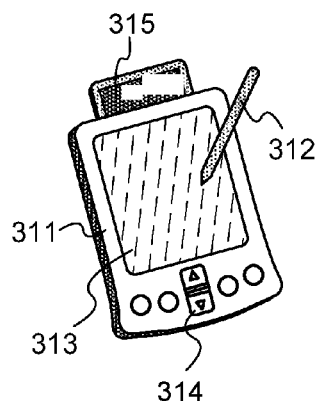

FIG. 13B illustrates a portable digital assistant (PDA) including the device including the nonvolatile memory element and/or the transistor according to the above embodiment. A main body 311 includes a display portion 313, an external interface 315, operation keys 314, and the like. Further, a stylus 312 is provided as an accessory for operation.

Figure 13E:
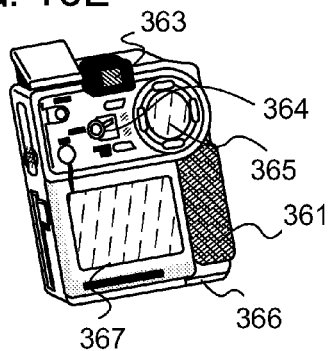
Figure 13C:
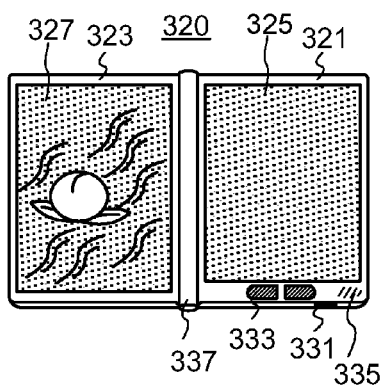

FIG. 13C illustrates an e-book reader 320 as an example of electronic paper including the device including the nonvolatile memory element and/or the transistor according to the above embodiment. The e-book reader 320 includes two housings: a housing 321 and a housing 323. The housing 321 is combined with the housing 323 by a hinge 337, so that the e-book reader 320 can be opened and closed with the hinge 337 used as an axis. Such a structure allows the e-book reader 320 to be used as a paper book.

The housing 321 includes a display portion 325, and the housing 323 includes a display portion 327. The display portion 325 and the display portion 327 can display a continuous image or different images. The structure for displaying different images allows text to be displayed on the right display portion (the display portion 325 in FIG. 13C) and images to be displayed on the left display portion (the display portion 327 in FIG. 13C).

FIG. 13C illustrates an example of the case where the housing 321 includes an operating portion and the like. For example, the housing 321 includes a power button 331, control keys 333, a speaker 335, and the like. The control keys 333 allow pages to be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, or the like may be provided on the back surface or the side surface of the housing. The e-book reader 320 may have a function of an electronic dictionary.

In addition, the e-book reader 320 may have a structure capable of transmitting and receiving data wirelessly. Through wireless communication, desired book data or the like can be purchased and downloaded from an electronic book server.

Note that electronic paper can be used in any field as long as data is displayed. For example, electronic paper can be applied to posters, advertisement in vehicles such as trains, and a variety of cards such as credit cards, as well as e-book readers.

FIG. 13D illustrates a cellular phone including the device including the nonvolatile memory element and/or the transistor according to the above embodiment. The cellular phone includes two housings: a housing 340 and a housing 341. The housing 341 includes a display panel 342, a speaker 343, a microphone 344, a pointing device 346, a camera lens 347, an external connection terminal 348, and the like. The housing 340 includes a solar cell 349 for charging the cellular phone, an external nonvolatile memory slot 350, and the like. An antenna is built in the housing 341.

The display panel 342 has a touch panel function. A plurality of control keys 345 which are displayed as an image are shown by dashed lines in FIG. 13D. Note that the cellular phone includes a booster circuit for increasing a voltage output from the solar cell 349 to a voltage needed for each circuit. In addition to the above structure, a noncontact IC chip, a small recording device, or the like may be built in the cellular phone.

The display orientation of the display panel 342 changes as appropriate in accordance with the application mode. Further, the camera lens 347 is provided on the same surface as the display panel 342, so that the cellular phone can be used as a video phone. The speaker 343 and the microphone 344 can be used for videophone calls, recording, and playing sound, etc. as well as voice calls. Moreover, the housings 340 and 341 which are shown unfolded in FIG. 13D can overlap with each other by sliding; thus, the size of the cellular phone can be reduced, which makes the cellular phone suitable for being carried.

The external connection terminal 348 is connectable to a variety of cables such as an AC adaptor or a USB cable, which enables charging of the cellular phone and data communication. Moreover, a larger amount of data can be saved and moved by inserting a recording medium to the external nonvolatile memory slot 350. In addition to the above functions, an infrared communication function, a television reception function, or the like may be provided.

FIG. 13E illustrates a digital camera including the device including the nonvolatile memory element and/or the transistor according to the above embodiment. The digital camera includes a main body 361, a display portion A 367, an eyepiece portion 363, an operation switch 364, a display portion B 365, a battery 366, and the like.

Figure 13F:
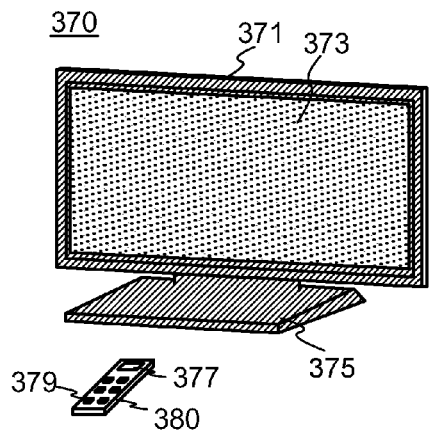

FIG. 13F illustrates a television set including the device including the nonvolatile memory element and/or the transistor according to the above embodiment. A television set 370 includes a housing 371 provided with a display portion 373. Images can be displayed on the display portion 373. Here, the housing 371 is supported by a stand 375.

The television set 370 can be operated by an operation switch included in the housing 371 or by a remote controller 380 separately provided. Channels and volume can be controlled by a control key 379 included in the remote controller 380, and images displayed on the display portion 373 can thus be controlled. Further, the remote controller 380 can be provided with a display portion 377 for displaying data output from the remote controller 380.

Note that the television set 370 preferably includes a receiver, a modem, and the like. With the receiver, a general television broadcast can be received. Furthermore, when the television set 370 is connected to a communication network by wired or wireless connection via the modem, one-way (from a transmitter to a receiver) or two-way (between a transmitter and a receiver, between receivers, or the like) data communication can be performed.

The structures and methods described in this embodiment can be combined as appropriate with any of the methods and structures described in any of the other embodiments.

(Embodiment 11)

In this embodiment, as an example of a device including a nonvolatile memory element which can be obtained according to any of the above embodiments, a wireless communication semiconductor device capable of inputting/outputting data without contact will be described. The wireless communication semiconductor device capable of inputting/outputting data without contact is also called an RFID tag, an ID tag, an IC tag, an RF tag, a wireless tag, an electronic tag, or a wireless chip.

Figure 14A:
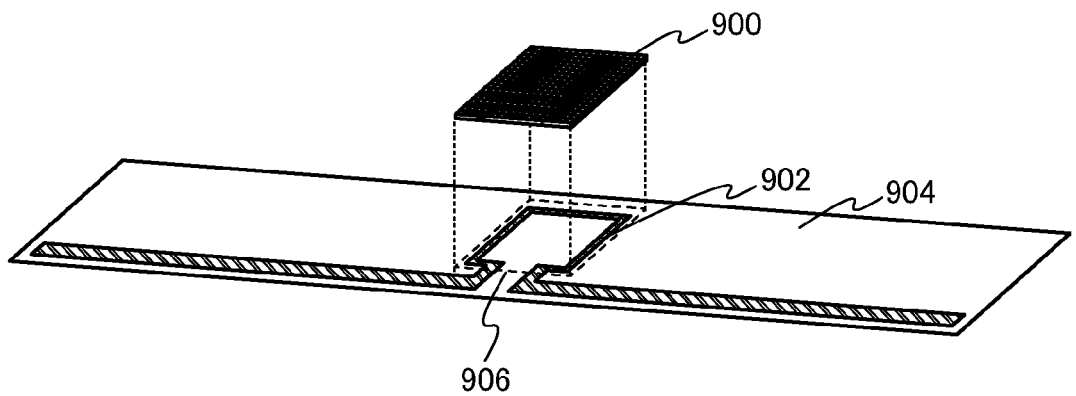
FIGS. 14A and 14B each illustrate an example of a wireless communication semiconductor device including a nonvolatile memory element.
Figure 14B:
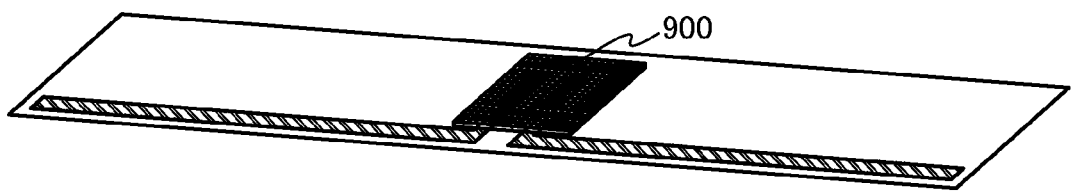

One example of a structure of the wireless communication semiconductor device of this embodiment will be described with reference to FIGS. 14A and 14B and FIG. 15. FIG. 14A is a perspective view of a semiconductor integrated circuit chip 900 and an antenna 902 provided over a supporting substrate 904. FIG. 14B is a perspective view of a semiconductor device in which the semiconductor integrated circuit chip 900 and the antenna 902 provided over the supporting substrate 904 illustrated in FIG. 14A are stacked.

The wireless communication semiconductor device illustrated in FIGS. 14A and 14B includes the semiconductor integrated circuit chip 900 provided with an antenna (also referred to as an on-chip antenna) and the supporting substrate 904 provided with the antenna 902 (also referred to as a booster antenna). The semiconductor integrated circuit chip 900 is provided over an insulating layer formed over the supporting substrate 904 and the antenna 902. The insulating layer may be formed by a sealant or the like as long as it can fix the semiconductor integrated circuit chip 900 to the supporting substrate 904 and the antenna 902.

Note that a conductive shield is preferably provided on a surface of the semiconductor integrated circuit chip 900 to prevent electrostatic breakdown of the semiconductor integrated circuit (e.g., malfunction of the circuit and damage to a semiconductor element) due to electrostatic discharge. Note that when the conductive shield has high resistance and the starting point and the ending point of the pattern of the antenna 902 are not electrically connected to each other, the antenna 902 and the conductive shield provided on the surface of the semiconductor integrated circuit chip 900 may be provided in contact with each other.

The communication method of the wireless communication semiconductor device of this embodiment may be an electromagnetic induction method or an electromagnetic coupling method. FIG. 15 illustrates an example in which the electromagnetic induction method or the electromagnetic coupling method is used.

Figure 15:
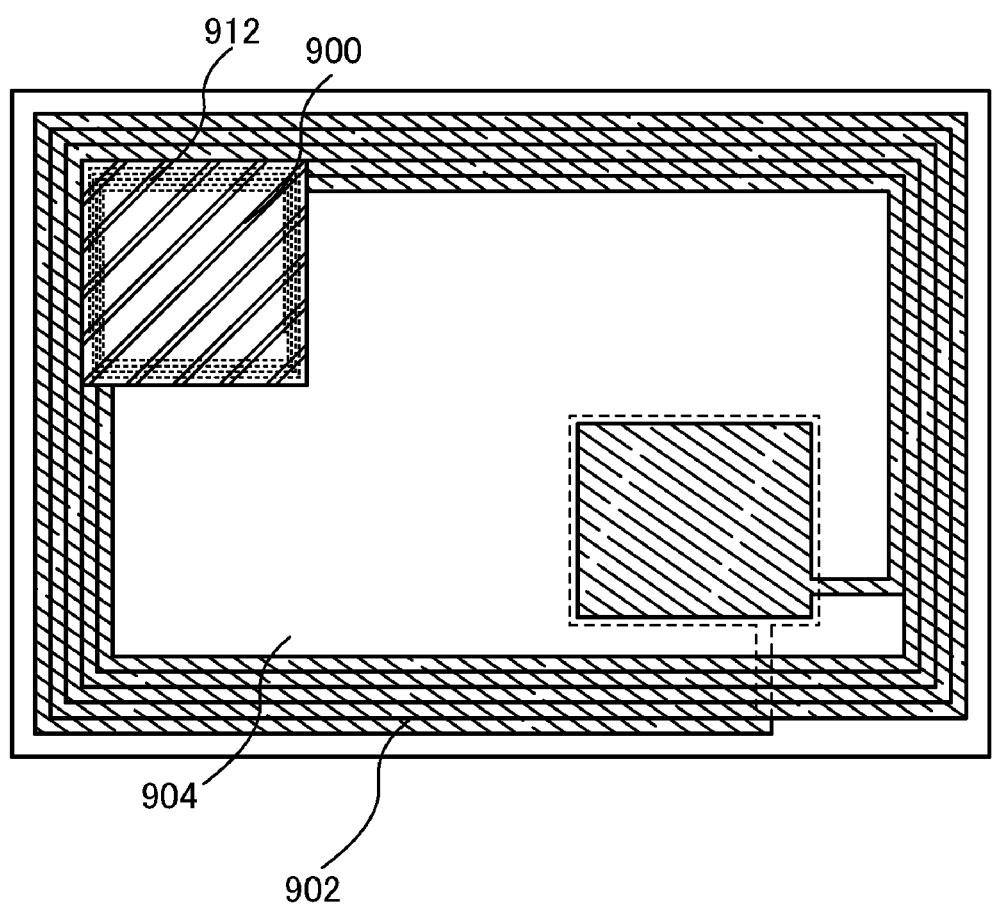
FIG. 15 illustrates an example of a wireless communication semiconductor device including a nonvolatile memory element.
Figure 16E:
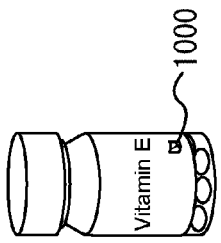
FIGS. 16A to 16F each illustrate an example of application of a wireless communication semiconductor device including a nonvolatile memory element.
Figure 16F:
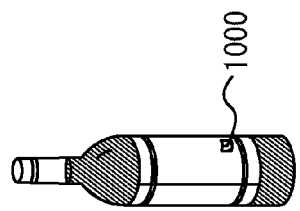
Figure 16C:
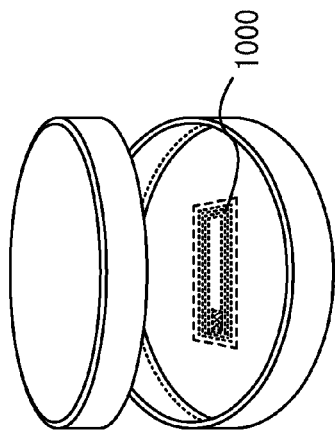
Figure 16D:
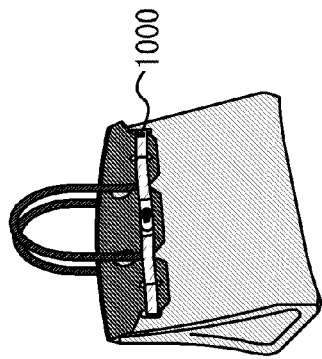
Figure 16A:
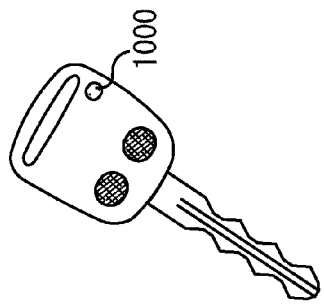
Figure 16B:
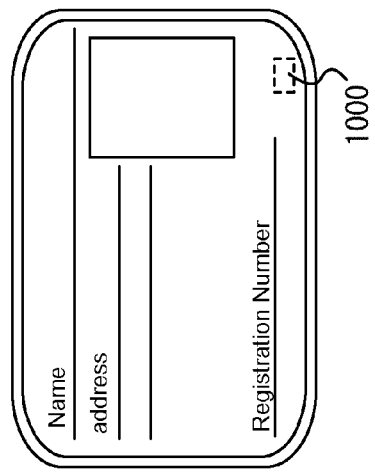

In FIG. 15, the antenna 902 is provided as a booster antenna over the supporting substrate 904, and the semiconductor integrated circuit chip 900 including a coiled antenna 912 is provided over the supporting substrate 904. Note that a capacitor is formed by being interposed between the antenna 902 which is the booster antenna and the supporting substrate 904.

A plurality of elements, such as nonvolatile memory elements or transistors, for forming a memory portion or a logic portion is provided in a semiconductor integrated circuit in the semiconductor integrated circuit chip 900. The nonvolatile memory element or the transistor described in any of the above embodiments can be used as the nonvolatile memory element or the transistor for forming the memory portion or the logic portion.

The nonvolatile memory element or the transistor described in any of the above embodiments has a small off-current. Accordingly, power consumption can be reduced by application of the nonvolatile memory element or the transistor to the wireless communication semiconductor device of this embodiment.

This embodiment can be freely combined with any of the other embodiments.

(Embodiment 12)

In this embodiment, examples in each of which the wireless communication semiconductor device described in the above embodiment is used will be described as one embodiment of the present invention.

FIGS. 16A to 16F illustrate application examples of a semiconductor device 1000 which is similar to the wireless communication semiconductor device described in the above embodiment. The semiconductor device 1000 can be used for a variety of items and systems by utilizing a function of sending and receiving an electromagnetic wave. As examples of the items, the followings are given: keys (see FIG. 16A), paper money, coins, securities, bearer bonds, certificates (such as a driver's license or a resident's card, see FIG. 16B), books, containers (such as a Petri dish, see FIG. 16C), personal accessories (such as a bag or eyeglasses, see FIG. 16D), packaging containers (such as wrapping paper or a bottle, see FIGS. 16E and 16F), recording media (such as a disk or video tape), vehicles (such as a bicycle), food, clothing, livingware, and electronic appliances (such as a liquid crystal display device, an EL display device, a television device, or a portable terminal). The semiconductor device 1000 is fixed to such items having a variety of shapes by being attached to the surface or embedded in the items. As examples of the systems, a goods management system, an authentication function system, and a distribution system are given.

By using the highly reliable semiconductor device described in the above embodiment in which power consumption is reduced and electrostatic discharge is suppressed, a highly reliable system can be realized.

This embodiment can be freely combined with any of the other embodiments.

This application is based on Japanese Patent Application serial no. 2009-260211 filed with Japan Patent Office on Nov. 13, 2009, the entire contents of which are hereby incorporated by reference.

The invention claimed is:

1. A semiconductor device comprising:
a nonvolatile memory element and a transistor,
wherein the nonvolatile memory element comprises:
a control gate;
a charge accumulation layer overlapping with the control gate; and
a first oxide semiconductor layer including a channel formation region and overlapping with the charge accumulation layer,
wherein the transistor comprises:
a gate electrode; and
a second oxide semiconductor layer including a channel formation region and overlapping with the gate electrode with an insulating film interposed between the second oxide semiconductor layer and the gate electrode,
wherein the nonvolatile memory element and the transistor are electrically connected to each other.

2. A semiconductor device according to claim 1, the nonvolatile memory element further comprising:
a source electrode and a drain electrode which are electrically connected to the first oxide semiconductor layer,
wherein at least one of the source electrode and the drain electrode has a portion overlapping with the charge accumulation layer with an insulating film therebetween.

3. A semiconductor device according to claim 1,
wherein memory cells each including the nonvolatile memory element and the transistor are arranged in matrix.

4. A semiconductor device according to claim 1,
wherein a hydrogen concentration of the first and the second oxide semiconductor layers is less than or equal to $5 \times 10^{19}/cm^3$.

5. A semiconductor device comprising:
a nonvolatile memory element and a transistor,
wherein the nonvolatile memory element comprises:
a control gate;
a charge accumulation layer overlapping with the control gate with a first insulating film therebetween; and
a first oxide semiconductor layer including a channel formation region and overlapping with the charge accumulation layer with a second insulating film therebetween,
wherein the transistor comprises:
a gate electrode; and
a second oxide semiconductor layer including a channel formation region and overlapping with the gate electrode with a third insulating film interposed between the second oxide semiconductor layer and the gate electrode,
wherein the nonvolatile memory element and the transistor are electrically connected to each other.

6. A semiconductor device according to claim 5, the nonvolatile memory element further comprising:
a source electrode and a drain electrode which are electrically connected to the oxide semiconductor layer,
wherein at least one of the source electrode and the drain electrode has a portion overlapping with the charge accumulation layer with the second insulating film therebetween.

7. A semiconductor device according to claim 5,
wherein memory cells each including the nonvolatile memory element and the transistor are arranged in matrix.

8. A semiconductor device according to claim 5,
wherein a hydrogen concentration of the first and the second oxide semiconductor layers is less than or equal to $5 \times 10^{19}/cm^3$.

9. A semiconductor device comprising:
a nonvolatile memory element, the nonvolatile memory element comprising:
a control gate;
a charge accumulation layer overlapping with the control gate with a first insulating film therebetween; and an oxide semiconductor layer including a channel formation region and overlapping with the charge accumulation layer with a second insulating film therebetween, a source electrode and a drain electrode which are electrically connected to the oxide semiconductor layer, wherein a width of the oxide semiconductor layer is larger than a width of the charge accumulation layer in a channel length direction, wherein one of the source electrode and the drain electrode has a portion overlapping with the charge accumulation layer and in contact with the second insulating film, and wherein the portion does not overlap with an end portion of the charge accumulation layer.

10. A semiconductor device according to claim 9,
wherein memory cells each including the nonvolatile memory element are arranged in matrix.

11. A semiconductor device according to claim 9 further comprising:
 a transistor, the transistor comprising:
  a gate electrode; and
  a second oxide semiconductor layer including a channel formation region and overlapping with the gate electrode with a third insulating film between the second oxide semiconductor layer and the gate electrode.

12. A semiconductor device according to claim 11,
wherein the nonvolatile memory element and the transistor are electrically connected to each other.

13. A semiconductor device according to claim 11 further comprising:
 memory cells each including the nonvolatile memory element and the transistor, which are arranged in matrix.

14. A semiconductor device according to claim 9,
wherein a hydrogen concentration of the oxide semiconductor layer is less than or equal to $5 \times 10^{19}/cm^3$.

* * * * *